United States Patent
Zhang et al.

(10) Patent No.: US 12,219,824 B2
(45) Date of Patent: Feb. 4, 2025

(54) DISPLAY PANEL WITH GROOVES FOR REDUCING BENDING STRESS

(71) Applicant: Wuhan China Star Optoelectronics Semiconductor Display Technology Co., Ltd., Wuhan (CN)

(72) Inventors: Shuyuan Zhang, Wuhan (CN); Jianfeng Chen, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/602,792

(22) PCT Filed: Sep. 2, 2021

(86) PCT No.: PCT/CN2021/116192
§ 371 (c)(1),
(2) Date: Oct. 11, 2021

(87) PCT Pub. No.: WO2023/004928
PCT Pub. Date: Feb. 2, 2023

(65) Prior Publication Data
US 2024/0172489 A1  May 23, 2024

(30) Foreign Application Priority Data
Jul. 29, 2021  (CN) .......................... 202110866483.3

(51) Int. Cl.
*H10K 59/124*  (2023.01)
*H10K 59/131*  (2023.01)
*H10K 102/00*  (2023.01)

(52) U.S. Cl.
CPC ......... *H10K 59/124* (2023.02); *H10K 59/131* (2023.02); *H10K 2102/311* (2023.02)

(58) Field of Classification Search
CPC ............... H10K 59/124; H10K 59/131; H10K 2102/311
See application file for complete search history.

(56) References Cited

U.S. PATENT DOCUMENTS

| | | | |
|---|---|---|---|
| 2004/0124763 A1* | 7/2004 | Nathan | H10K 59/12 313/498 |
| 2018/0175311 A1* | 6/2018 | Jin | H10K 59/12 |
| 2021/0375942 A1* | 12/2021 | Wang | H01L 27/124 |

FOREIGN PATENT DOCUMENTS

| | | |
|---|---|---|
| CN | 108538898 A | 9/2018 |
| CN | 109300964 A | 2/2019 |
| CN | 109585514 A | 4/2019 |
| CN | 112071268 A | 12/2020 |
| CN | 112599542 A | 4/2021 |

(Continued)

*Primary Examiner* — Lisa S Landis
(74) *Attorney, Agent, or Firm* — Nathan & Associates; Menachem Nathan

(57) ABSTRACT

The present disclosure provides a display panel. The display panel comprises a base and a pixel driving circuit layer. The pixel driving circuit layer comprises a plurality of pixel driving circuits; the pixel driving circuit layer comprises a first semiconductor layer, a first insulating layer, and a second semiconductor layer stacked on the base. Wherein, the pixel driving circuit layer comprises first grooves located between the pixel driving circuits and opened in the first insulating layer, and a first organic spacer layer disposed in the first grooves.

14 Claims, 16 Drawing Sheets

(56) References Cited

FOREIGN PATENT DOCUMENTS

| IN | 112071882 A | 12/2020 |
|----|-------------|---------|
| KR | 20130076402 A | 7/2013 |

\* cited by examiner

DISPLAY PANEL WITH GROOVES FOR REDUCING BENDING STRESS

BACKGROUND OF DISCLOSURE

Field of Disclosure

The present disclosure relates to the field of display technology, in particular to a display panel.

Description of Prior Art

With development of display technology, low temperature polycrystalline oxide (LTPO) has received more and more attention as a low power display technology. Compared with a low temperature poly-silicon thin film transistor (LTPS TFT), a low temperature polycrystalline oxide thin film transistor (LTPO TFT) has a lower driving power. In addition, the LTPO TFT converts a part of transistors into oxide with less leakage current, so it is widely used in display panels such as an organic light-emitting diode (OLED).

SUMMARY OF DISCLOSURE

At present, as flexible foldable displays have gradually become a main development direction in the display field, during a dynamic bending process of a display panel such as using LTPO technology, threshold voltages of thin film transistors are likely to drift due to influence of bending stress, resulting in a relative large difference in brightness before and after the display panel is bent.

The embodiment of the present disclosure provides a display panel to alleviate the technical problem of brightness difference caused by a current display panel during the bending process.

The present disclosure provides a display panel comprising:
  a base; and
  a pixel driving circuit layer disposed on the base and comprising a plurality of pixel driving circuits;
  wherein the pixel driving circuit layer comprises: a first semiconductor layer, a first insulating layer, and a second semiconductor layer stacked on the base; and
  wherein the pixel driving circuit layer comprises first grooves located between the pixel driving circuits and opened in the first insulating layer, and a first organic spacer layer disposed in the first grooves.

In the display panel provided by the present disclosure, the display panel comprises a display area, and the first grooves comprise a plurality of first sub-grooves located in the display area and a plurality of second sub-grooves intersecting with the first sub-grooves, the plurality of the first sub-grooves and the plurality of the second sub-grooves divide the display area into a plurality of sub-areas, and at least one of the pixel driving circuits is disposed in each of the sub-grooves.

In the display panel provided by the present disclosure, the display panel comprises at least one bending centerline in the display area, and the first sub-grooves or the second sub-grooves are arranged along a direction perpendicular to the bending centerline.

In the display panel provided by the present disclosure, the display panel further comprises a bending wire area located at a side of the display area, a second insulating layer is disposed on the second semiconductor layer, and a first metal layer is disposed on the second insulating layer; and
wherein the pixel driving circuit layer comprises second grooves located in the bending wire area and penetrating at least the first insulating layer and the second insulating layer, and a second organic spacer layer disposed in the second grooves.

In the display panel provided by the present disclosure, the display area and the bending wire area are arranged side by side along a first direction, and a plurality of third grooves are opened in the second organic spacer layer; and
  in the first direction, two adjacent third grooves are arranged in a wave shape, and the third grooves are filled with an inorganic spacer layer.

In the display panel provided by the present disclosure, the first metal layer comprises a plurality of signal wires extending along the first direction and located in the bending wire area, the plurality of third grooves are correspondingly disposed under each of the signal wires, and a part of each of the signal wires corresponding to the third grooves is arranged in a W shape along inner walls of each of the third grooves and located between the second organic spacer layer and the inorganic spacer layer.

In the display panel provided by the present disclosure, the pixel driving circuit layer further comprises a planarization layer disposed on the first metal layer, and the planarization layer and the inorganic spacer layer is an integrally formed structure.

In the display panel provided by the present disclosure, the first grooves penetrate the first insulating layer and the second insulating layer, and the first organic spacer layer and the second organic spacer layer is an integrally formed structure.

In the display panel provided by the present disclosure, an organic insulating layer is disposed between the second insulating layer and the first metal layer, and the organic insulating layer, the first organic spacer layer, and the second organic spacer layer is an integrally formed structure.

In the display panel provided by the present disclosure, the base comprises a substrate and an inorganic insulating layer disposed on the substrate, and the first grooves sequentially penetrate the inorganic insulating layer, the first insulating layer, and the second insulating layer, and the first organic spacer layer is filled in the first grooves.

In the display panel provided by the present disclosure, the base further comprises a buffer layer between the substrate and the inorganic insulating layer, and the second grooves penetrate the buffer layer, the organic insulating layer, the first insulating layer, and the second insulating layer, and the second organic spacer layer is filled in the second grooves.

In the display panel provided by the present disclosure, the first metal layer comprises scan bridge wires located on the second insulating layer and the first organic spacer layer, two adjacent pixel driving circuits located in different sub-areas are bridged by the scan bridge wires.

In the display panel provided by the present disclosure, the display panel further comprises a plurality of light-emitting devices D1 arranged in an array, and the pixel driving circuits are configured to drive the light emitting devices to emit light D1, and each of the pixel driving circuits comprises:
  a first initialization transistor T4 configured to input an initialization signal VI to a first node Q under control of a first scan signal Scan1;
  a switching transistor T2 configured to input a data signal Vdata to a second node A under control of a second scan signal Scan2;

a driving transistor T1 configured to drive one of the light-emitting devices D1 to emit light under control of potentials of the first node Q and the second node A;

a compensation transistor T3 connected to the driving transistor T1 through the first node Q and a third node B, and configured to compensate a threshold voltage of the driving transistor T1 under control of the third scan signal Scan3;

a second initialization transistor T7 configured to input the initialization signal VI to an anode of the light-emitting device under the control of the third scan signal Scan3;

a first light-emitting control transistor T5 connected to the driving transistor T1 through the second node A, and configured to turn on a current flowing from a power high-potential signal line to the driving transistor T1 under control of a light-emitting control signal EM;

a second light-emitting control transistor T6 connected to the driving transistor T1 through the third node B, and configured to turn on a current flowing from the driving transistor T1 to the anode C of the light-emitting device D1 under the control of the light-emitting control signal EM; and a storage capacitor C1 connected to the driving transistor T1 through the first node Q, and connected to the power high-potential signal line through a fourth node D, and configured to store the data signal Vdata;

wherein the scan bridge wires are respectively bridged with the first initialization transistor T4, the switching transistor T2, the compensation transistor T3, the second initialization transistor T7, the first light-emitting control transistor T5, and the second light-emitting control transistor T6 through vias.

In the display panel provided by the present disclosure, the first insulating layer comprises a first insulating sub-layer disposed on the first semiconductor layer, a second insulating sub-layer disposed on the first insulating sub-layer, and a third insulating sub-layer disposed on the second insulating sub-layer, and the second insulating layer comprises a fourth insulating sub-layer disposed on the second semiconductor layer and a fifth insulating layer disposed on the fourth insulating sub-layer; and wherein each of the pixel driving circuits comprises a second metal layer disposed between the first insulating sub-layer and the second insulating sub-layer, a third metal layer disposed between the second insulating sub-layer and the third insulating sub-layer, and a fourth metal layer disposed between the fourth insulating sub-layer and the fifth insulating sub-layer.

In the display panel provided by the present disclosure, the second metal layer is patterned to form a gate of the switching transistor T2, a gate of the light-emitting control transistor T5, a gate of the second light-emitting control transistor T6, a gate of the driving transistor T1, a first scan signal line connected to the gate of the switching transistor T2, a second scan signal line connected to the gate of the light emitting control transistor T5 and the gate of the second light emitting control transistor T6, and a first plate of the storage capacitor C1, and the gate of the driving transistor T1 is connected to the first plate of the storage capacitor C1; and the scan bridge wires comprise a first bridge wire and a second bridge wire, and each of the pixel driving circuit layers comprises a first via and a second via penetrating the second insulating sub-layer, the third insulating sub-layer, the fourth insulating sub-layer, and the fifth insulating layer, the first bridge wire is connected to the first scan signal line through the first via, and the second bridge wire is connected to the second scan signal line through the second via.

In the display panel provided by the present disclosure, the fourth metal layer is patterned to form a top gate of the first initialization transistor T4, a top gate of the compensation transistor T3, and a top gate of the second initialization transistor T7, a third scan signal line connected to the top gate of the first initialization transistor T4, a fourth scan signal line connected to the top gate of the compensation transistor T3, and a fifth scan signal line connected to the top gate of the second initialization transistor T7; and the scan bridge wires comprise a third bridge wire, a fourth bridge wire, and a fifth bridge wire, and each of the pixel driving circuit layers comprises a third via, a fourth via, and a fifth via penetrating the fourth insulating sub-layer and the fifth insulating sub-layer, the third bridge wire is connected to the third scan signal line through the third via, the fourth bridge wire is connected to the fourth scan signal line through the fourth via, and the fifth bridge wire is connected to the fifth scan signal line through the fifth via.

In the display panel provided by the present disclosure, the third metal layer is patterned to form a bottom gate of the first initialization transistor T4, a bottom gate of the compensation transistor T3, a bottom gate of the second initialization transistor T7, a sixth scan signal line connected to the bottom gate of the first initialization transistor T4, a seventh scan signal line connected to the bottom gate of the compensation transistor T3, an eighth scan signal line connected to the bottom gate of the second initialization transistor T7, and a second plate of the storage capacitor C1; and the scan bridge wires comprise a sixth bridge wire, a seventh bridge wire, and an eighth bridge wire, and each of the pixel driving circuit layers comprises a sixth via, a seventh via, and an eighth via penetrating the third insulating sub-layer, the fourth insulating sub-layer, and the fifth insulating sub-layer, the sixth bridge wire is connected to the sixth scan signal line through the sixth via, and the seventh bridge wire is connected to the seventh scan signal line through the seventh via, and the eighth bridge wire is connected to the eighth scan signal line through the eighth via.

In the display panel provided by the present disclosure, the second semiconductor layer forms an active layer of the first initialization transistor T4 and an active layer of the second initialization transistor T7; and the scan bridge wires comprise a ninth bridge wire and a tenth bridge wire, and each of the pixel driving circuit layers comprises a ninth via and a tenth via penetrating the fourth insulating sub-layer and the fifth insulating sub-layer, the ninth bridge wire is connected to the active layer of the first initialization transistor T4 through the ninth via, and the tenth bridge wire is connected to the active layer of the second initialization transistor T7 through the tenth via.

The present disclosure provides a display panel, comprising:

a base; and a pixel driving circuit layer disposed on the base, and the pixel driving circuit layer comprises a plurality of pixel drive circuits;

wherein the pixel driving circuit layer comprises: a first semiconductor layer, a first insulating layer, and a second semiconductor layer stacked on the base;

the pixel driving circuit layer comprises first grooves located between the pixel driving circuits and opened in the first insulating layer, and a first organic spacer layer disposed in the first grooves;

the display panel comprises a display area, the first grooves comprises a plurality of first sub-grooves located in the display area and a plurality of second sub-grooves intersecting with the first sub-grooves, and the plurality of first sub-grooves and the plurality of the second sub-grooves divide the display area into a plurality of sub-areas, and each of the sub-areas is provided with at least one of the pixel driving circuits;

the display panel comprises at least one bending centerline located in the display area, and the first sub-grooves or the second sub-grooves are arranged along a direction perpendicular to the bending centerline;

the display panel further comprises a bending wire area on a side of the display area, a second insulating layer is disposed on the second semiconductor layer, and a first metal layer is disposed on the second insulating layer; and the pixel driving circuit layer comprises second grooves located in the bending wire area and penetrating at least the first insulating layer and the second insulating layer, and a second organic spacer layer disposed in the second grooves.

In the display panel provided by the present disclosure, the first metal layer comprises scan bridge wires on the second insulating layer and the first organic spacer layer, two adjacent pixel driving circuits located in different sub-areas are bridged by the scan bridge wires.

Beneficial effect of the present disclosure: in the display panel provided by the present disclosure, the first insulating layer is provided with the first grooves located between the pixel driving circuits, and the first organic spacer layer is disposed in the first grooves, so that stress generated when the display panel is bent can be concentrated and released at the first grooves, which reduces influence of the bending stress on performance of thin film transistor devices in the pixel driving circuits, prevents threshold values of the thin film transistors from drifting, and stabilizes display brightness during the bending process of the display panel.

DESCRIPTION OF DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION OF EMBODIMENTS

Figure 1:
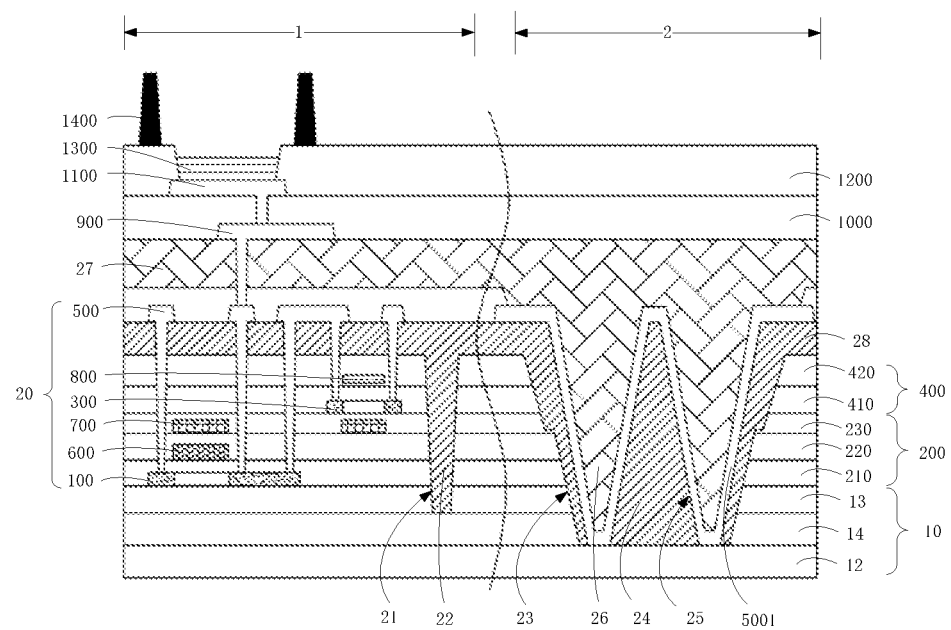
FIG. 1 is a schematic diagram of a cross-sectional structure of each film layer in a display panel provided by an embodiment of the present disclosure.

The description of the following embodiments refers to the attached drawings to illustrate specific embodiments in which the present disclosure can be implemented. The directional terms mentioned in the present disclosure, such as [up], [down], [front], [back], [left], [right], [inner], [outer], [side], etc., are only the direction of the attached drawings. Therefore, the directional terms used are used to describe and understand the present disclosure, rather than to limit the present disclosure. In the drawings, units with similar structures are indicated by the same reference numerals.

In the description of the present disclosure, it should be understood that the term "first", "second" are for illustrative purposes only and are not to be construed as indicating or imposing a relative importance or implicitly indicating the number of technical features indicated. Thus, a feature that limited by "first", "second" may expressly or implicitly comprise at least one of the features. In the description of the present disclosure, the meaning of "plural" is two or more, unless otherwise specifically defined.

In the description of the present disclosure, it should be noted that the terms "installation", "connection" and "coupling" should be understood in a broad sense, unless otherwise clearly specified and defined. For example, it can be a fixed connection, a detachable connection, or integrated connection; it can be a mechanical connection, an electrical connection or can communicate with each other; it can be directly connected or indirectly connected through an intermediary, it can also be the connection between two elements or the interaction between two elements. Those ordinary skilled in the art can understand the specific meanings of the above terms in the present disclosure according to specific situations.

Technical solutions of the present disclosure will now be described in conjunction with specific embodiments.

Figure 2:
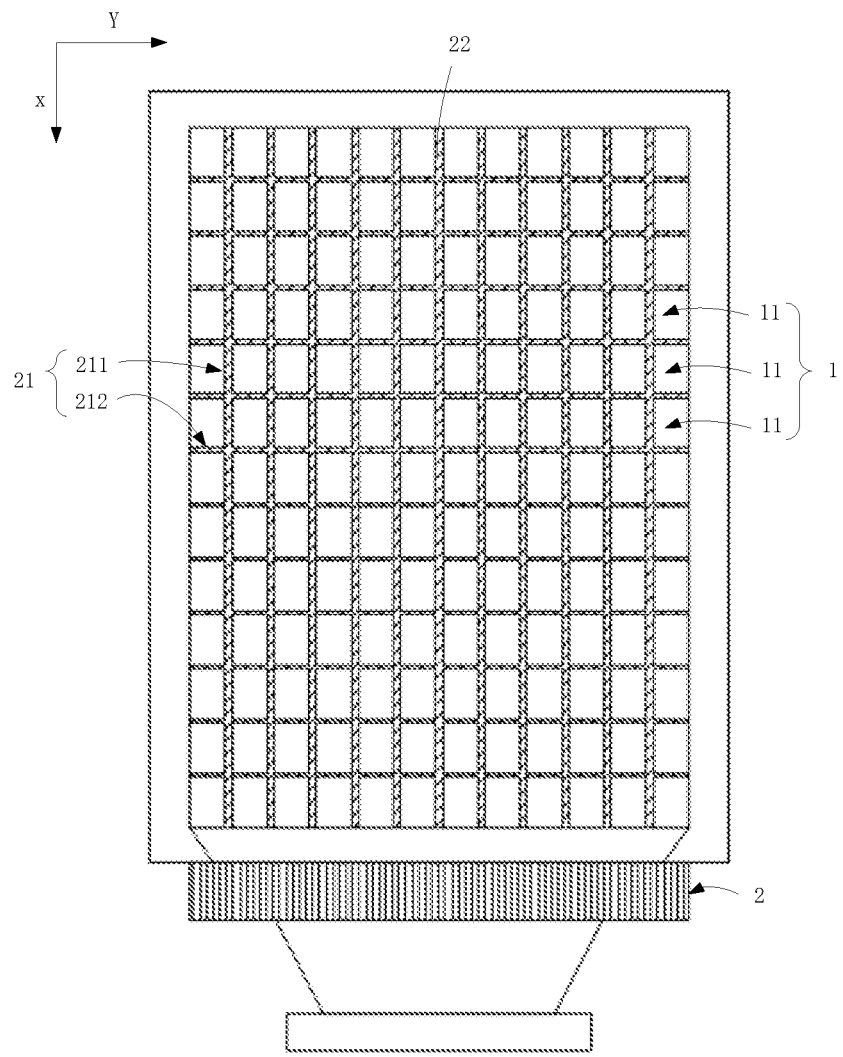
FIG. 2 is a top view of the display panel provided by the embodiment of the present disclosure.

Referring to FIG. 1 to FIG. 2, an embodiment of the present disclosure provides a display panel, comprising:
  a base 10; and
  a pixel driving circuit layer 20 disposed on the base 10, wherein the pixel driving circuit layer 20 comprises a plurality of pixel driving circuits;
The pixel driving circuit layer 20 comprises: a first semiconductor layer 100, a first insulating layer 200, and a second semiconductor layer 300 stacked on the base 10;
Wherein, the pixel driving circuit layer 20 comprises first grooves 21 located between the pixel driving circuits and opened in the first insulating layer 200, and an organic spacer layer 22 disposed in the first grooves 21.

It is understandable that, as flexible and foldable displays gradually become a main development direction in the display field, during a dynamic bending process of a display panel, threshold voltages of thin film transistors are likely to drift due to influence of a bending stress, which leads to a relative large brightness difference before and after bending the display panel. In addition, for example, in a display panel using LTPO technology, a thickness of an array substrate is large due to presence of different layers of LTPS TFT and LTPO TFT, and the LTPS TFT and/or LTPO TFT are further affected by the bending stress. In this embodiment, the first insulating layer 200 is provided with the first grooves 21 located between the pixel driving circuits, and the first organic spacer layer 22 is disposed in the first grooves 21, so that stress generated when the display panel is bent can be concentrated and released at the first grooves 21, which reduces influence of the bending stress on performance of thin film transistor devices in the pixel driving circuits, prevents threshold values of the thin film transistors from drifting, and stabilizes display brightness during the bending process of the display panel.

It should be noted that, the first grooves 21 are opened in the first insulating layer 200. In this embodiment, a depth of the first grooves 21 may be less than a thickness of the first insulating layer 200. That is, the first grooves 21 may be opened on any side of the first insulating layer 200 without penetrating the first insulating layer 200. Apparently, the first grooves 21 may also penetrate the first insulating layer 200 to form through grooves, which is not limited herein.

Figure 3:
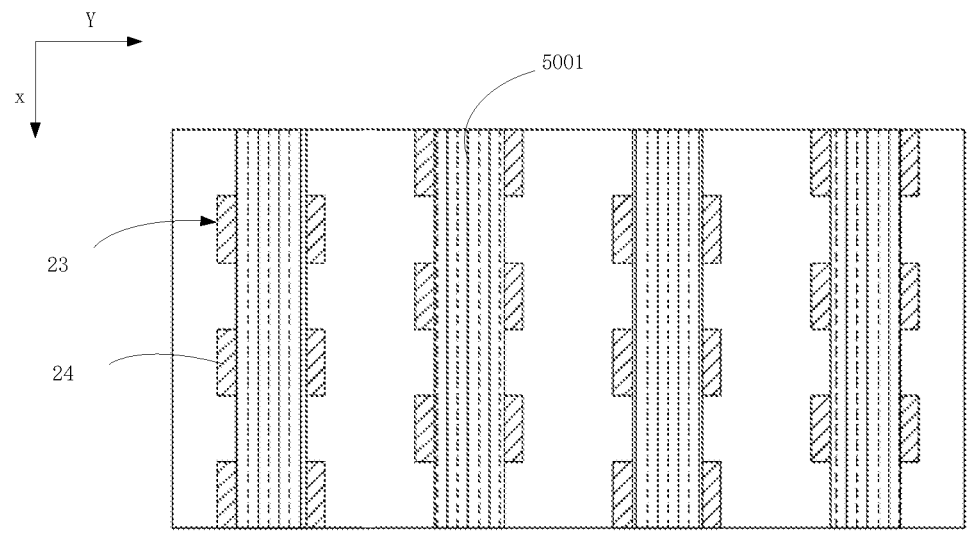
FIG. 3 is a schematic structural diagram of the display panel in a bending wire area provided in the embodiment of the present disclosure.

In one embodiment, referring to FIGS. 1 to 3, the display panel comprises a display area 1, and the first grooves 21 comprise a plurality of first sub-grooves 211 located in the display area 1 and a plurality of second sub-grooves 212 intersected by the first sub-grooves 211, the plurality of first sub-grooves 211 and the plurality of second sub-grooves 212 divide the display area 1 into a plurality of sub-areas 11, and each of the sub-areas 11 is provided with at least one pixel driving circuit.

It is understandable that, the first sub-grooves 211 and the second sub-grooves 212 are arranged in different directions, and the display area is divided by the plurality of first sub-grooves 211 and the plurality of second sub-grooves 212 into the plurality of sub-areas 11, and each of the sub-areas 11 is provided with at least one pixel driving circuit, and thus a structure that completely surrounds the pixel driving circuits on all sides is formed. When the display panel is bent along any axis, the first sub-grooves 211 and the second sub-grooves 212 can both play a good stress relief effect, thereby improving adaptability to different bending conditions of the display panel, guaranteeing stability of the performance of the thin film transistor devices in the pixel driving circuit to the greatest extend, and stabilizing the display brightness during the bending process of the display panel. It should be noted that, in the sub-areas 11 divided by the plurality of first sub-grooves 211 and the plurality of second sub-grooves 212, a number of the pixel driving circuits provided in each sub-area 11 is not limited. In the embodiments of the present disclosure, unless otherwise specified, description is made by taking an arrangement of one pixel driving circuit in each sub-area 11 as an example.

In this embodiment, referring to FIGS. 1 to 3, the display panel comprises at least one bending centerline located in the display area 1, and the first sub-grooves 211 or the second sub-grooves 212 are disposed along a direction perpendicular to the bending centerline.

It is understandable that, the display panel comprises at least one bending centerline located in the display area 1, that is, the display panel can be bent around the bending centerline, and during the display panel is bent, the first sub-grooves 211 and/or the second sub-grooves 212 need to play a role of stress relief. Apparently, when the first sub-grooves 211 or the second sub-grooves 212 are disposed along the direction perpendicular to the bending centerline, the first sub-grooves 211 or the second sub-grooves 212 can achieve the best stress relief effect, and an influence of the bending of the display panel on the thin film transistors in the pixel driving circuits is minimized.

Continuing, it should be noted that the display panel comprises the at least one bending centerline located in the display area 1, that is, the display panel may also comprise a first bending centerline and a second bending centerline located in the display area 1. When the first sub-grooves 211 are arranged perpendicular to the first bending centerline, the second sub-grooves 212 may also be arranged perpendicular to the second bending centerline, which is not limited here.

In one embodiment, referring to FIGS. 1 to 3, the display panel further comprises a bending wire area 2 located on a side of the display area 1, and a second insulating layer 400 is disposed on the second semiconductor layer 300, and a first metal layer 500 is disposed on the second insulating layer 400;

The pixel driving circuit layer 20 comprises second grooves 23 located in the bending wire area 2 and penetrating at least the first insulating layer 200 and the second insulating layer 400, and a second organic spacer layer 24 disposed in the second grooves 23.

It is understandable that, pad bending technology, as a main technical means to realize a narrow frame of the display panel, is mainly achieved by bending a part of the display panel in the bending wire area 2 to achieve the narrow frame. At present, large bending stress is prone to be generated in the pad bending process, which causes film structures in the bending wire area 2 to be easily broken or peeled; in this embodiment, the second grooves 23 are disposed in the bending wire area 2, and the second organic spacer layer 24 is filled in the second grooves 23, so that the bending stress generated in the pad bending process can be released at the second grooves 23, which prevents the bending stress causing the film layers located in the bending wire area 2 to break or peel off.

In this embodiment, referring to FIGS. 1 to 3, the display area 1 and the bending wire area 2 are arranged side by side along a first direction X, and the second organic spacer layer 24 is provided with a plurality of third grooves 25;

In the first direction X, two adjacent third grooves 25 are arranged in a wave shape, and the third grooves 25 are filled with an inorganic spacer layer 26.

It can be understood that, by opening the plurality of third grooves 25 in the second organic spacer layer 24 located in the second grooves 23, and filling the inorganic spacer layer 26 in the third grooves 25, that is, the first insulating layer 200, the second insulating layer 400, the second organic spacer layer 24, and the inorganic spacer layer 26 are formed with inorganic materials and organic materials alternately stacked in a concavo-convex structure, and in the first direction X, two adjacent third grooves 25 may be arranged in a wave shape, which increases contact areas between film layers, and can also make the display panel better release the bending stress generated by the pad bending at the second grooves 23, and prevents the bending stress causing the film layers in the bending wire area 2 to crack or peel off.

In this embodiment, referring to FIGS. 1 to 3, the first metal layer 500 comprises a plurality of signal wires 5001 extending along the first direction X and located in the bending wire area 2, the plurality of third grooves 25 are correspondingly provided under each signal wire 5001, and a part of each of the signal wires 5001 corresponding to the third grooves 25 is arranged in a W shape along inner walls of each third groove 25, and is located between the second organic spacer layer 24 and the inorganic spacer layer 26.

It can be understood that, the plurality of signal wires 5001 extend along the first direction X and are arranged side by side along a second direction Y, and the second direction Y and the first direction X are arranged at a predetermined angle. Specifically, the first direction X is perpendicular to the second direction Y. Apparently, the plurality of third grooves 25 are correspondingly provided under each signal wire 5001, that is, each signal wire 5001 is arranged above the plurality of third grooves 25 arranged in a wave shape, and the part of each of the signal wires 5001 corresponding to the third grooves 25 is disposed along the inner walls of each third groove 25 in a W shape and located between the second organic spacer layer 24 and the inorganic spacer layer 26. By arranging the signal wires 5001 in a W shape, a bending resistance of the signal wires 5001 is improved, and contact areas between the signal wires 5001 and the second organic spacer layer 24 and the inorganic spacer layer 26 are increased, so that cracking or peeling of the signal wires 5001 can be prevented.

It should be noted that, in the second direction Y, a width of the third grooves 25 is greater than or equal to a width of the signal wires 5001, so that each of the signal wires 5001 runs along the inner walls of each third groove 25 in a W shape and located between the second organic spacer layer 24 and the inorganic spacer layer 26. Specifically, in the second direction Y, two groove groups are arranged side by side, each groove group comprises at least two third grooves 25 arranged along the first direction X, and the third grooves 25 in two adjacent groove groups may be arranged in a one-to-one correspondence. It can also be arranged in a staggered manner, but it is not limited here.

In one embodiment, referring to FIGS. 1 to 3, the pixel driving circuit layer 20 further comprises a first planarization layer 27 disposed on the first metal layer 500, and the first planarization layer 27 and the inorganic spacer layer 26 is an integrally formed structure.

It is understandable that, both the first planarization layer 27 and the inorganic spacer layer 26 may be inorganic insulating materials, and the first planarization layer 27 and the inorganic spacer layer 26 are formed into an integral structure, that is, the first planarization layer 27 and the inorganic spacer layer 26 can be made by a same manufacturing process. On the basis of realizing release of the bending stress caused by the pad bending, additional process is omitted and manufacturing costs is saved.

In one embodiment, referring to FIGS. 1 to 3, each of the first grooves 21 penetrates the first insulating layer 200 and the second insulating layer 400, and the first organic spacer layer 22 and the second organic spacer layer 24 is an integrally formed structure.

It is understandable that, both the first organic spacer layer 22 and the second organic spacer layer 24 may be organic insulating materials, and the first organic spacer layer 22 and the second organic spacer layer 24 are arranged to form an integrally formed structure, that is, the first organic spacer layer 22 and the second organic spacer layer 24 can be made by a same manufacturing process, and when the first groove 21 penetrates the first insulating layer 200 and the second insulating layer 400, the first grooves 21 and the second grooves 23 can also be formed by a same manufacturing process, so that on the basis of ensuring that the bending stress generated by display bending and the pad bending is released, the additional process is omitted, and the manufacturing costs of the display panel is greatly reduced.

In this embodiment, referring to FIGS. 1 to 3, an organic insulating layer 28 is disposed between the second insulating layer 400 and the first metal layer 500. The organic insulating layer 28, the first organic spacer layer 22, and the second organic spacer layer 24 are integrally formed. It is understandable that the organic insulating layer 28, the first organic spacer layer 22, and the second organic spacer layer 24 can all be made of organic insulating materials, and the organic insulating layer 28, the first organic spacer layer 22, and the second organic spacer layer 24 are arranged in an integrally formed structure, that is, the organic insulating layer 28, the first organic spacer layer 22, and the second organic spacer layer 24 can be manufactured by a same process, so that on the basis of ensuring that the bending stress generated by the display bending and the pad bending is released, the additional process is omitted, and the manufacturing costs of the display panel is greatly reduced.

In one embodiment, referring to FIGS. 1 to 3, the base 10 comprises a substrate 12 and an inorganic insulating layer 13 disposed on the substrate 12, and the first grooves 21 sequentially penetrate the inorganic insulating layer 13, the first insulating layer 200, and the second insulating layer 400, and the first organic spacer layer 22 is filled in the first grooves 21.

It is understandable that, the first grooves 21 penetrate the inorganic insulating layer 13, the first insulating layer 200, and the second insulating layer 400 in sequence, that is, the first grooves 21 are not only disposed in the pixel driving circuit layer 20, but is further extended to the inorganic insulating layer 13 of the substrate 12, and the first organic spacer layer 22 is filled in the first grooves 21, so that the first grooves 21 and the first organic spacer layer 22 penetrate a plurality of film layer structures to achieve a better release effect on the bending stress generated when the display panel is bent for display.

In one embodiment, referring to FIGS. 1 to 3, the base 10 further comprises a buffer layer 14 located between the substrate 12 and the inorganic insulating layer 13, and the second grooves 23 penetrate the buffer layer 14, the inorganic insulating layer 13, the first insulating layer 200, and the second insulating layer 400 in sequence, and the second organic spacer layer 24 is filled in the second grooves 23.

It can be understood that, the second grooves 23 sequentially penetrate the buffer layer 14, the inorganic insulating layer 13, the first insulating layer 200, and the second insulating layer 400, that is, the second grooves 23 are not only disposed in the pixel driving circuit layer 20, but also extend to the inorganic insulating layer 13 and the buffer layer 14 on the substrate 12, and the second organic spacer layer 24 is filled in the second grooves 23, so that the second grooves 23 and the second organic spacer layer 24 penetrate a plurality of film layer structures, so as to achieve a better release effect on the bending stress generated by the display panel during the pad bending.

In one embodiment, referring to FIGS. 1 to 3, the first metal layer 500 comprises scan bridge wires located on the second insulating layer 400 and the first organic spacer layer 22, and two adjacent pixel driving circuits located in different sub-areas 11 are bridged by the scan bridge wires.

It can be understood that, the first metal layer 500 is located on a side of the first organic spacer layer 22 away from the substrate 12, and two adjacent pixel driving circuits located in different sub-areas 11 are separated by the first grooves 21 and the first organic spacer layer 22 located in the first grooves 21. The first metal layer 500 comprises the scan bridge wires located on the second insulating layer 400 and the first organic spacer layer 22, and two adjacent pixel driving circuits located in different sub-areas 11 are bridged by the scan bridge wires to realize connection between the pixel driving circuits. In addition, by bridging two adjacent pixel driving circuits located in different sub-areas 11, an overall bending resistance of the pixel driving circuits and the scan bridge wires is also improved.

Figure 4:
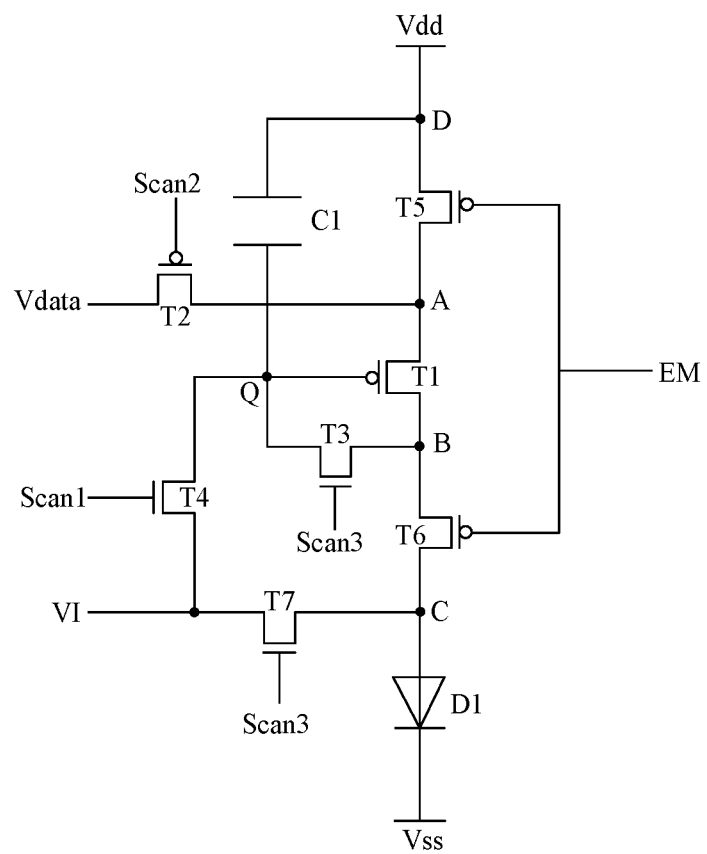
FIG. 4 is a schematic structural diagram of a pixel driving circuit in the display panel provided by the embodiment of the present disclosure.
Figure 5:
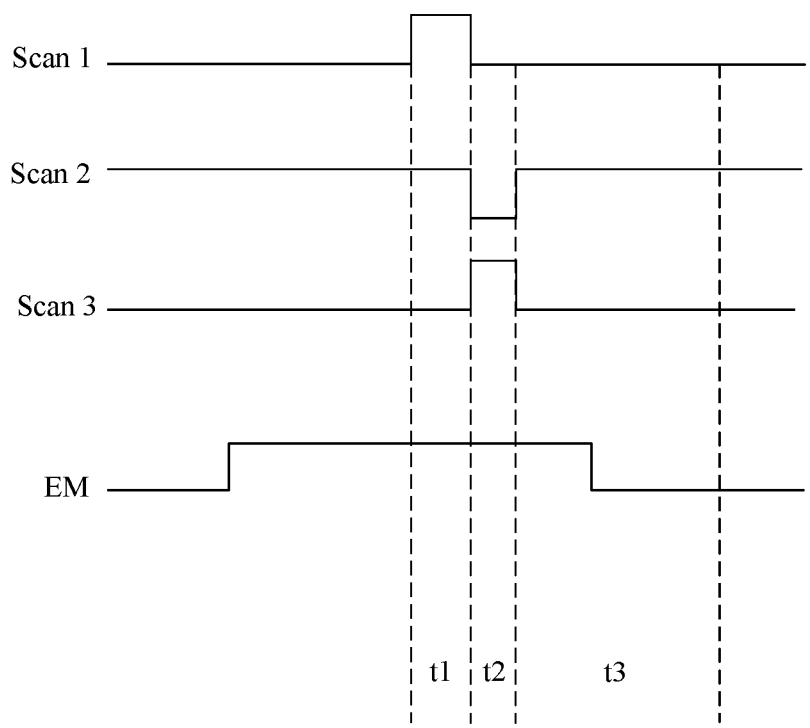
FIG. 5 is a timing diagram of various signals in the pixel driving circuit in the display panel provided by the embodiment of the present disclosure.

In an embodiment, referring to FIGS. 4 to 5, the display panel further comprises a plurality of light-emitting devices D1 arranged in an array, the pixel driving circuits are configured to drive the light-emitting devices D1 to emit light, and each of the pixel driving circuits comprises:

A first initialization transistor T4 configured to input an initialization signal VI to a first node Q under control of a first scan signal Scant;

A switching transistor T2 configured to input a data signal Vdata to a second node A under control of a second scan signal Scan2;

A driving transistor T1 configured to drive the light-emitting device D1 to emit light under control of potentials of the first node Q and the second node A;

A compensation transistor T3 connected to the driving transistor T1 through the first node Q and a third node B, and configured to compensate a threshold voltage of the driving transistor T1 under control of a third scan signal Scan3;

A second initialization transistor T7 configured to input the initialization signal VI to an anode of the light-emitting device under the control of the third scan signal Scan3;

A first light-emitting control transistor T5 connected to the driving transistor T1 through the second node A, and configured to turn on a current flowing from a power high potential signal line to the driving transistor T1 under control of a light-emitting control signal EM;

A second light-emitting control transistor T6 connected to the driving transistor T1 through the third node B, and configured to turn on a current flowing from the driving transistor T1 to the anode C of the light-emitting device D1 under the control of the light-emitting control signal EM;

A storage capacitor C1 connected to the driving transistor T1 through the first node Q, and connected to the power high potential signal line through a fourth node D, and configured to store the data signal Vdata;

Wherein, the scan bridge wires are respectively bridged with the first initialization transistor T4, the switching transistor T2, the compensation transistor T3, the second initialization transistor T7, the first light-emitting control transistor T5, and the second light-emitting control transistor T6 through vias.

It should be noted that, as shown in FIG. 5, which is a timing diagram of the pixel driving circuit of the present disclosure in a display phase, in this embodiment, the compensation transistor T3, the first initialization transistor T4, and the second initialization transistor T7 are N-type transistors; the switching transistor T2, the driving transistor T1, the first light-emitting control transistor T5, and the second light-emitting control transistor T6 are P-type transistors.

In a reset phase t1, the second scan signal Scan2 is at a high potential, the switching transistor T2 is turned off; the third scan signal Scan3 is at a low potential, the compensation transistor T3 and the second initialization transistor T7 are turned off; the light-emitting control signal EM is at a high potential, the light-emitting control transistor T5 and the second light-emitting control transistor T6 are turned off; and the first scan signal Scant is at a high potential, and the first initialization transistor T4 is turned on, and an initialization signal is input to the first node Q to pull down a potential of the first node Q.

In a data writing phase t2, the first scan signal Scant is at a low potential, the first initialization transistor T4 is turned off; the second scan signal Scan2 is at a low potential, the switching transistor T2 is turned on; and the third scan signal Scan3 is at a high potential, the compensation transistor T3 and the second initialization transistor T7 are turned on. Since the potential of the first node Q is low, a gate and a second electrode of the driving transistor T1 are short circuit after the compensation transistor T3 is turned on. A voltage difference is generated between the gate and a first electrode of the driving transistor T1 through a threshold voltage of the driving transistor T1. At this time, the driving transistor T1 is turned on, and the switching transistor T2 inputs the data signal Vdata to the second node A. The data signal Vdata comprises a compensated threshold voltage and is input to the gate of the driving transistor T1, and thus threshold voltage deviation of the driving transistor T1 is compensated. The written data signal Vdata charges the first node Q through the driving transistor T1 until the voltage of the first node Q becomes Vdata-Vth, and the driving transistor T1 is turned off. In addition, since the second initialization transistor T7 is turned on, the anode of the light-emitting device D1 receives the initialization signal and is reset.

In a light-emitting phase t3, the light-emitting control signal EM is at a low level, the first light-emitting control transistor T5 and the second light-emitting control transistor T6 are turned on, and the currents flowing from the power high potential signal line VDD to the driving transistor T1 and flowing from the driving transistor T1 to the anode C of the light-emitting device D1 are turned on, and a driving current flowing through the light-emitting device D1 at this time satisfies the formula I=1/2K[Vdd−(Vdata−Vth)−Vth]$^2$=1/2K[Vdd−Vdata]$^2$. The light-emitting device D1 operates and emits light under action of the driving current I.

It can be understood that, in each of the pixel driving circuits, the driving transistor T1 is configured to drive the light-emitting device D1 to emit light under the control of the potentials of the first node Q and the second node A. The first initialization transistor T4, the switching transistor T2, the compensation transistor T3, the second initialization transistor T7, the first light-emitting control transistor T5, and the second light-emitting control transistor T6 are bridged by the vias, so as to achieve a circuit connection between two adjacent pixel driving circuits located in different sub-areas 11.

In an embodiment, please referring to FIG. 1. The first insulating layer 200 comprises a first insulating sub-layer 210 disposed on the first semiconductor layer 100, a second insulating sub-layer 220 disposed on the first insulating sub-layer 210, and a third insulating sub-layer 230 disposed on the second insulating sub-layer 220. The second insulating layer 400 comprises a fourth insulating sub-layer 410 disposed on the second semiconductor layer 300 and a fifth insulating sub-layer 420 disposed on the fourth insulating sub-layer 410;

The pixel driving circuit comprises a second metal layer 600 disposed between the first insulating sub-layer 210 and the second insulating sub-layer 220, a third metal layer 700 disposed between the second insulating sub-layer 220 and the third insulating sub-layer 230, and a fourth metal layer 800 disposed between the fourth insulating sub-layer 410 and the fifth insulating sub-layer 420.

It should be noted that, please referring to FIG. 1, which is a schematic diagram of a cross-sectional structure of each film layer in the display panel provided by the embodiment of the present disclosure, the display panel comprises the substrate 12, the first semiconductor layer 100, the second metal layer 600, the third metal layer 700, the second semiconductor layer 300, the fourth metal layer 800, and the first metal layer 500 stacked from bottom to top; wherein, the first semiconductor layer 100 forms a polysilicon active layer of each low-temperature polysilicon transistor, and the second semiconductor layer 300 forms an oxide active layer of each oxide transistor. In addition, the display panel also comprises a fifth metal layer 900, a second planarization layer 1000, an anode layer 1100, a pixel definition layer 1200, an organic light emitting layer 1300, and a spacer layer 1400 stacked from bottom to top on the first planarization layer 27.

Figure 6:
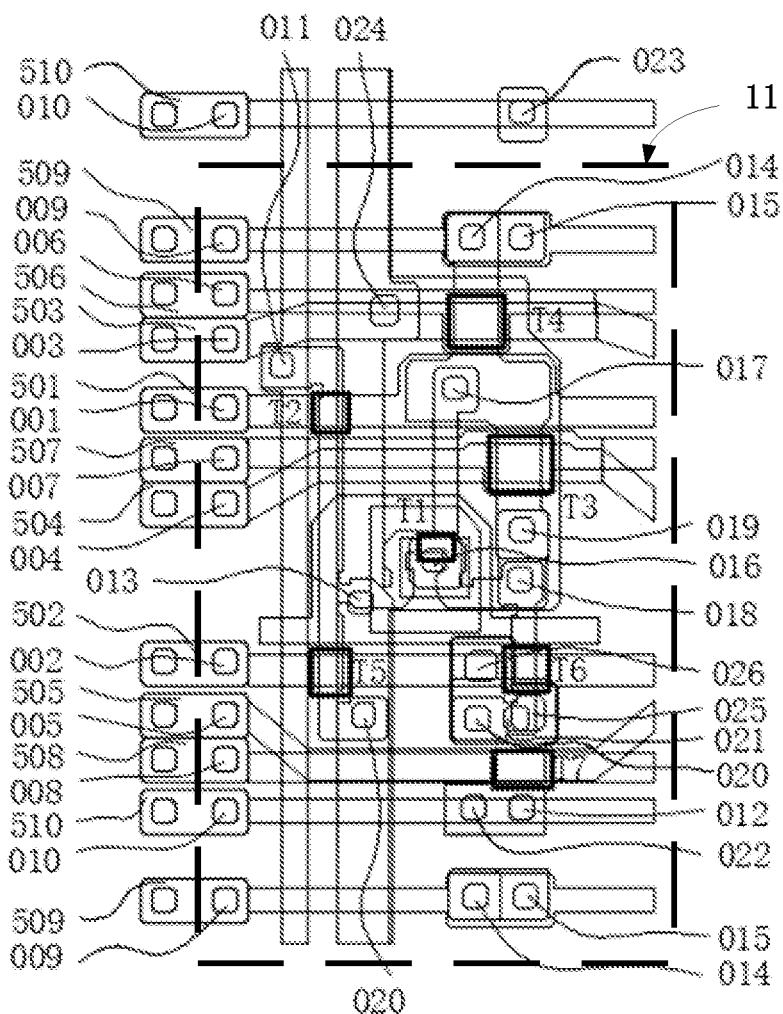
FIG. 6 is a schematic diagram of a planar superimposed structure of each film layer in the display panel provided by the embodiment of the present disclosure.

In FIG. 1, a transistor on a left side is a film layer structure of a low-temperature polysilicon transistor, and a transistor on a right side is a film layer structure of an oxide transistor. In each of the pixel driving circuits, structures of the switching transistor T2, the driving transistor T1, the first light-emitting control transistor T5, and the second light-emitting control transistor T6 are same as a structure of the transistor on the left side of FIG. 1. Structures of the compensation transistor T3, the first initialization transistor T4, and the second initialization transistor T7 are same with a structure of the transistor on the right side of FIG. 1. FIG. 6 is a schematic diagram of a planar superimposed structure of each film layer in the display panel provided by the embodiment of the present disclosure, and FIG. 7 to FIG. 12 are schematic planar diagrams of each film layer, respectively.

It can be understood that, when the first insulating layer 200 comprises the first insulating sub-layer 210 disposed on the first semiconductor layer 100, the second insulating sub-layer 220 disposed on the first insulating sub-layer 210, and the third insulating sub-layer 230 disposed on the second insulating sub-layer 220, and the first grooves 21 are opened in the first insulating layer 200, that is, the first grooves 21 may be arranged to penetrate at least one of the first insulating sub-layer 210, the second insulating sub-layer 220, and the third insulating sub-layer 230. In addition, the second insulating layer 400 comprises the fourth insulating sub-layer 410 disposed on the second semiconductor layer and the fifth insulating sub-layer 420 disposed on the fourth insulating sub-layer 410. In this embodiment, in order to achieve a better release effect on the bending stress generated when the display panel is bent for display, the first grooves 21 are arranged to penetrate at least the first insulating sub-layer 210, the second insulating sub-layer 220, the third insulating sub-layer 230, the fourth insulating sub-layer 410, and the fifth insulating sub-layer 420 in order, so as to separate the pixel driving circuits in different sub-areas 11, and the two adjacent pixel drive circuits located in different sub-areas 11 need to be bridged by the scan bridge wires. The film layer structure of each transistor in the pixel driving circuit and how to bridge the structure will be specifically described below in conjunction with specific embodiments.

Referring to FIG. 1, the substrate 12 may comprise a rigid substrate or a flexible substrate. When the substrate 12 is a rigid substrate, materials may be metal or glass. When the substrate 12 is a flexible substrate, the materials may comprise at least one of acrylic resin, methacrylic resin, polyisoprene, vinyl resin, epoxy-based resin, polyurethane-based resin, cellulose resin, siloxane resin, polyimide-based resin, or polyamide-based resin. In this embodiment, the substrate 12 is the flexible substrate.

Figure 7:
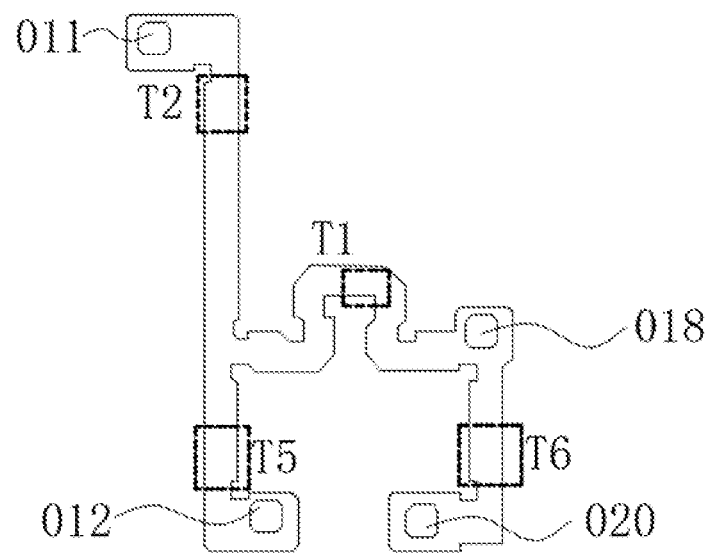
FIG. 7 is a schematic diagram of a planar structure of a first semiconductor layer in the display panel provided by the embodiment of the present disclosure.
Figure 8:
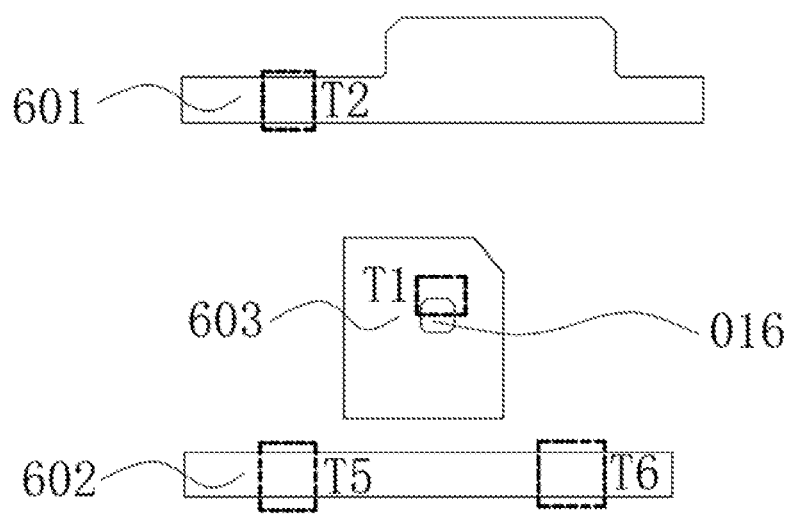
FIG. 8 is a schematic diagram of a planar structure of a second metal layer in the display panel provided by the embodiment of the present disclosure.

Referring to FIGS. 6-7, the first semiconductor layer 100 is patterned to form the polysilicon active layers of the switching transistor T2, the driving transistor T1, the first light-emitting control transistor T5, and the second light-emitting control transistor T6, and the polysilicon active layers of the transistors are connected to each other. The polysilicon active layer can be formed by crystallizing amorphous silicon. The crystallization method may comprise rapid thermal annealing (RTA), solid phase crystallization (SPC), excimer laser annealing (ELA), metal induced crystallization (MIC), metal induced lateral crystallization (MILC) and sequential lateral solidification (SLS), etc.

In one embodiment, referring to FIGS. 6, 8, 13, 14, and 15, the second metal layer 600 is patterned to form a gate of the switching transistor T2, a gate of the first light-emitting control transistor T5, a gate of the second light-emitting control transistor T6, the gate of the driving transistor T1, a first scan signal line 601 connected to the gate of the switching transistor T2, a second scan signal line 602 connected to the gate of the first light-emitting control transistor T5 and the gate of the second light-emitting control transistor T6, and a first plate 603 of the storage capacitor C1, and the gate of the driving transistor T1 is connected to the first plate 603 of the storage capacitor C1;

The scan bridge wires comprise a first bridge wire 501 and a second bridge wire 502, and the pixel driving circuit layer 20 comprises a first via 001 and a second via 002 penetrating the second insulating sub-layer 220, the third insulating sub-layer 230, the fourth insulating sub-layer 410, and the fifth insulating sub-layer 420, and the first bridge wire 501 is connected to the first scan signal line 601 through the first via 001, and the second bridge wire 502 is connected to the second scan signal line 602 through the second via 002.

It can be understood that, the second metal layer 600 is formed on the first insulating sub-layer 210, and the second metal layer 600 is formed with the first scan signal line 601 connecting the gate of the switching transistor T2, and the second scan signal line 602 connecting the gate of the first light-emitting control transistor T5 and the gate of the second light-emitting control transistor T6. The first bridge wire 501 is connected to the first scan signal line 601 through the first via 001, and the second bridge wire 502 is connected to the second scan signal line 602 through the second via 002 to realize layer change connection of the first scan signal line 601 and the second scan signal line 602, wherein the first scan signal lines 601 in the two adjacent pixel driving circuits located in different sub-areas 11 are connected by the first bridge wire 501, that is, each end of the first bridge wire 501 is connected to the first scan signal line 601 in one of the pixel driving circuits. Similarly, each end of the second bridge wire 502 is connected to the second scan signal line 602 in one of the pixel driving circuits, which will not be repeated here. In this embodiment, materials of the second metal layer 600 may comprise at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W).

It should be noted that, referring to FIGS. 6 to 12, projections of the first scan signal line 601 and the polysilicon active layer on the substrate 12 have an intersection area, and a portion of the first scan signal line 601 located in the intersection area forms the gate of the switching transistor T2, and a portion of the polysilicon active layer in the intersection area forms a channel region of the switching transistor T2. The second scan signal line 602 is a light-emitting control signal line, projections of the second scan signal line 602 and the polysilicon active layer on the substrate 12 have an intersection area, a portion of the second scan signal line 602 located in the intersection area respectively forms the gate of the first light-emitting control transistor T5 and the gate of the second light-emitting control transistor T6, and portions of the polysilicon active layer located in the intersecting area respectively form a channel region of the first light-emitting control transistor T5 and a channel region of the second light-emitting control transistor T6. Projections of the first plate 603 of the storage capacitor and the polysilicon active layer on the substrate 12 also have an intersection area, a portion of the first plate 603 of the storage capacitor located in the intersection area forms the gate of the driving transistor T1, and a portion of the polysilicon active layer located in the intersection area forms a channel region of the driving transistor T1. Wherein, parts of the polysilicon active layer except for the above-mentioned channel regions is ion-doped to form a source region and a drain region of each low-temperature polysilicon transistor. Through the ion doping and intersecting arrangement of the first scan signal line, a second electrode of the switching transistor T2, a second electrode of the first light-emitting control transistor T5, and the first electrode of the driving transistor T1 are connected, and the second electrode of the driving transistor T1 and a first electrode of the second light-emitting control transistor T6 are connected.

Figure 13:
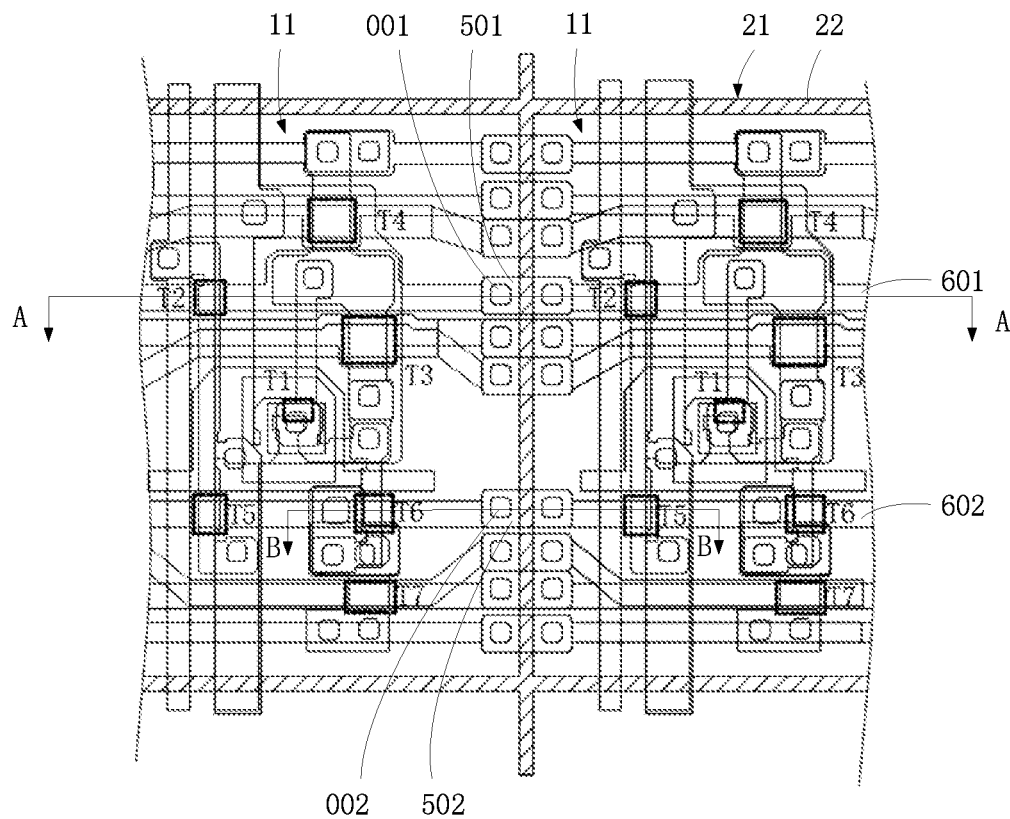
FIG. 13 is a schematic structural diagram of a structure in which two adjacent pixel driving circuits located in different sub-areas are bridged in a second metal layer in the display panel according to the embodiment of the present disclosure.
Figure 14:
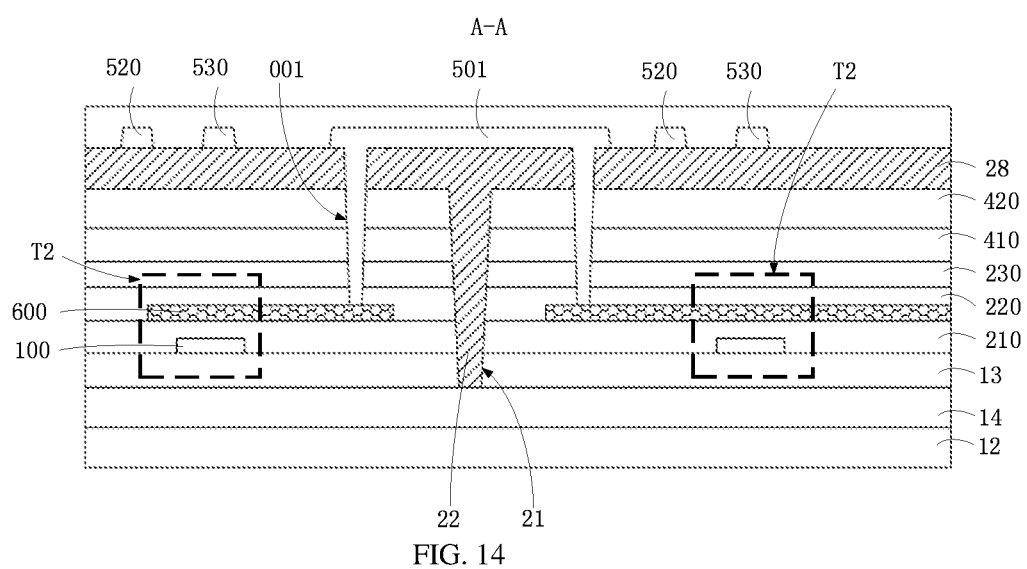
FIG. 14 is a schematic cross-sectional structural diagram at position A-A in FIG. 13.
Figure 15:
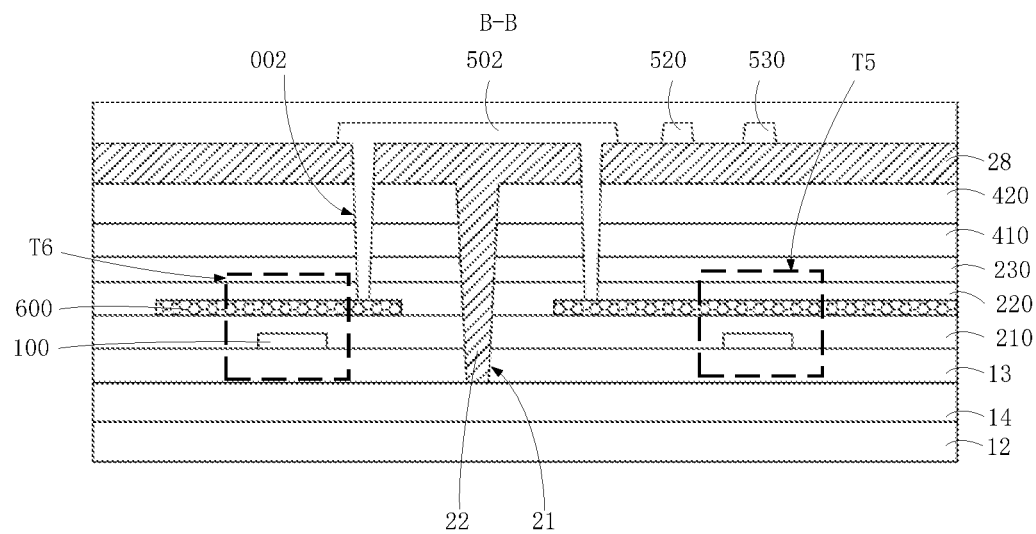
FIG. 15 is a schematic cross-sectional structural diagram at position B-B in FIG. 13.

It is should be noted that, referring to FIG. 13, the first via 001 and the second via 002 may be disposed in the sub-area 11 and located on peripheral side of the sub-area 11, so as to prevent positions of the first via 001 and the second via 002 from overlapping positions of the pixel driving circuits to increase wiring complexity. In addition, along an extension direction of the first scan signal line 601, when at least two pixel driving circuits are disposed in one of the sub-areas 11, the first scan signal line 601 in each pixel driving circuit can be connected in a same layer. Similarly, a connection principle of a connection structure of the second scan signal lines 602 is the same as that of the first scan signal lines 601, and will not be repeated here.

Figure 9:
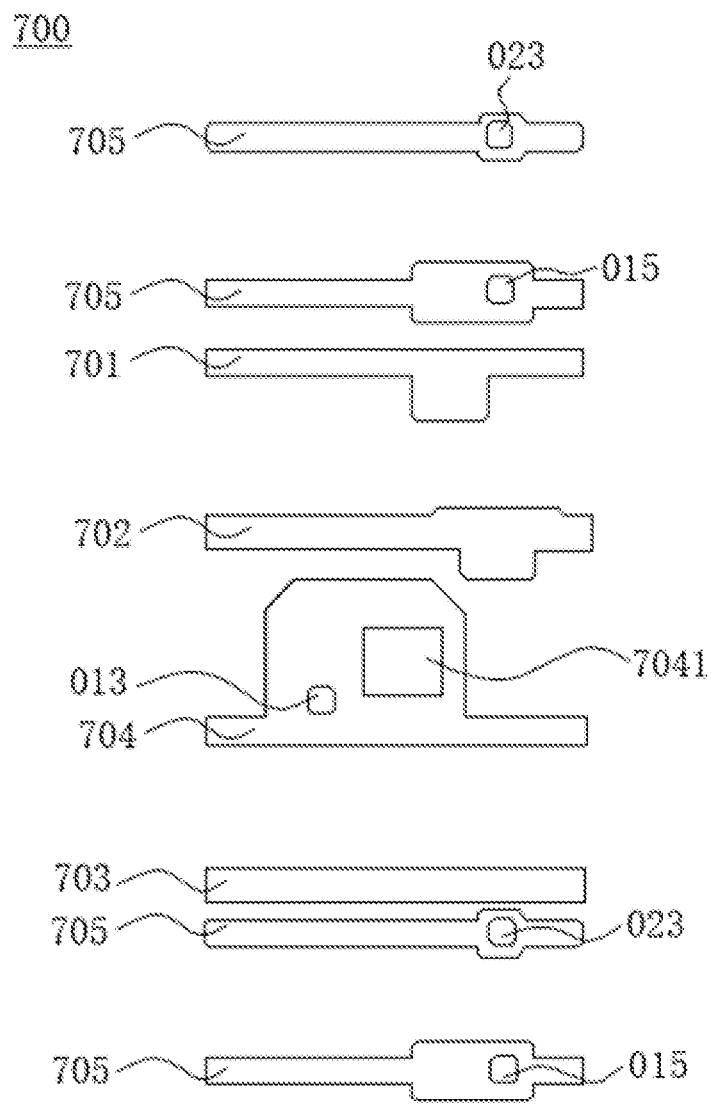
FIG. 9 is a schematic diagram of a planar structure of a third metal layer in the display panel provided by the embodiment of the present disclosure.
Figure 10:
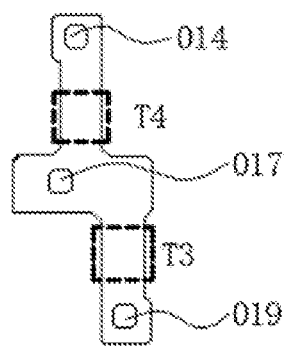
FIG. 10 is a schematic diagram of a planar structure of a second semiconductor layer in the display panel provided by the embodiment of the present disclosure.
Figure 10:
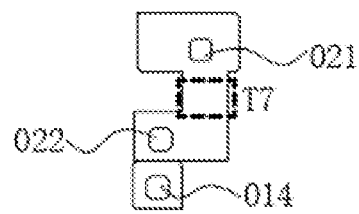

In one embodiment, referring to FIG. 6, FIG. 9, FIG. 16, FIG. 17, FIG. 18, and FIG. 19, the third metal layer 700 is patterned to form a bottom gate of the first initialization transistor T4, a bottom gate of the compensation transistor T3, a bottom gate of the second initialization transistor T7, a sixth scan signal line 701 connected to the bottom gate of the first initialization transistor T4, a seventh scan signal line 702 connected to the bottom gate of the compensation transistor T3, an eighth scan signal line 703 connected to the bottom gate of the second initialization transistor T7, and a second plate 704 of the storage capacitor C1. In addition, the third metal layer 700 is also patterned and formed with an eleventh scan signal line 705, and the eleventh scan signal line 705 is the initialization signal line VI. It should be noted that an upmost eleventh scan signal line 705 in FIG. 9 is a scan signal line of the pixel driving circuit corresponding to a previous light-emitting device, a bottom eleventh scan signal line 705 is a scan signal line in the pixel driving circuit corresponding to a next light-emitting device.

The scan bridge wires comprise a sixth bridge wire 506, a seventh bridge wire 507, and an eighth bridge wire 508. The pixel driving circuit layer 20 comprises a sixth via 006, a seventh via 007, and an eighth via 008 penetrating the third insulating sub-layer 230, the fourth insulating sub-layer 410, and the fifth insulating sub-layer 420, the sixth bridge wire 506 is connected to the sixth scan signal line 701 through the sixth via 006, the seventh bridge wire 507 is connected to the seventh scan signal line 702 through the seventh via 007, and the eighth bridge wire 508 is connected to the eighth scan signal line 703 through the eighth via 008.

It can be understood that the third metal layer 700 is disposed on the second insulating sub-layer 220, and the third metal layer 700 is patterned to form the bottom gate of the first initialization transistor T4, the bottom gate of the compensation transistor T3, the bottom gate of the second initialization transistor T7, the sixth scan signal line 701 connected to the bottom gate of the first initialization transistor T4, the seventh scan signal line 702 connected to the bottom gate of the compensation transistor T3, and the eighth scan signal line 703 connected to the bottom gate of the second initialization transistor T7. The sixth bridge wire 506 is connected to the sixth scan signal line 701 through the sixth via 006, the seventh bridge wire 507 is connected to the seventh scan signal line 702 through the seventh via 007, and the eighth bridge wire 508 is connected to the eighth scan signal line 703 through the eighth via 008 to realize layer change connection of the sixth scan signal line 701, the seventh scan signal line 702, and the eighth scan signal line 703. Wherein, the sixth scan signal lines 701 in the two adjacent pixel driving circuits located in different sub-areas 11 are connected by the sixth bridge wire 506, that is, each end of the sixth bridge wire 506 are connected to the sixth scan signal line 701 in one of the pixel driving circuits. Similarly, each end of the seventh bridge wire 507 is connected to the seventh scan signal line 702 in one of the pixel driving circuits, and each end of the eighth bridge wire 508 is connected to the eighth scan signal line 703 in one of the pixel driving circuits, which will not be repeated here. In this embodiment, materials of the fourth metal layer 800 may comprise at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (T1), tantalum (Ta), or tungsten (W).

Figure 16:
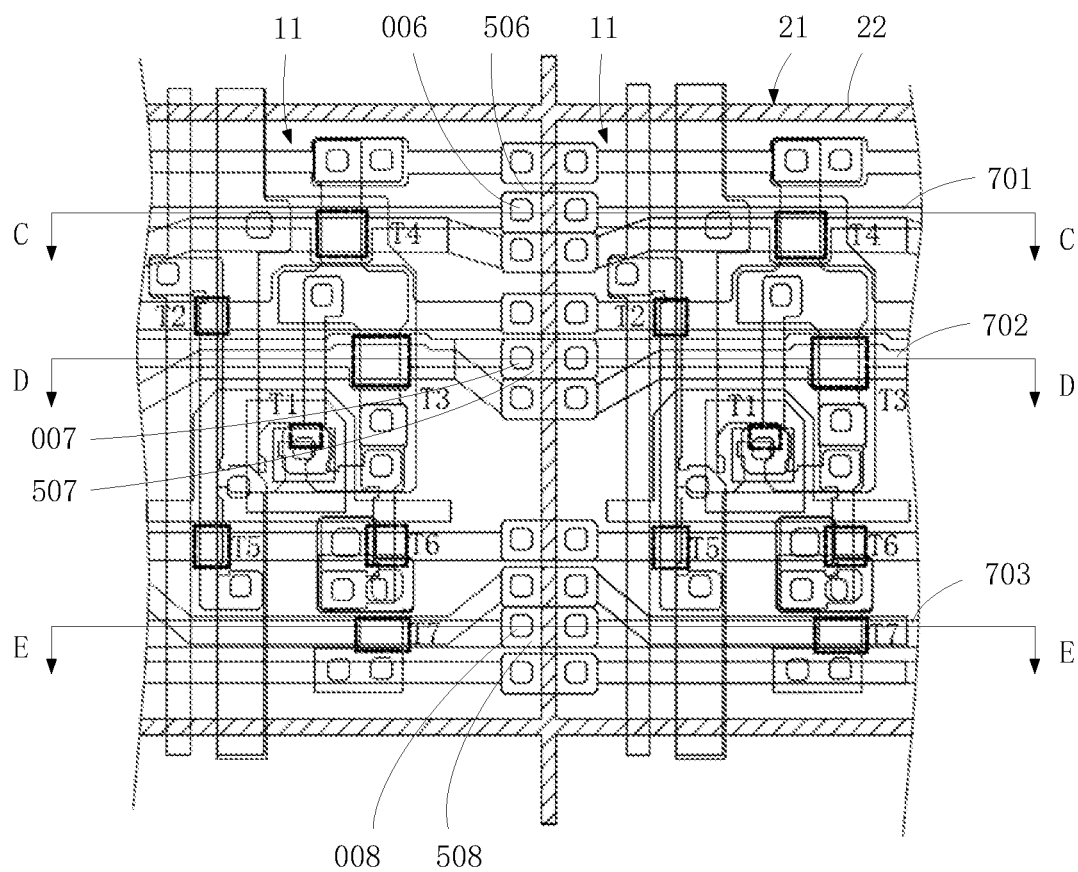
FIG. 16 is a schematic structural diagram of a structure in which two adjacent pixel driving circuits located in different sub-areas are bridged in a third metal layer in the display panel according to an embodiment of the present disclosure.
Figure 17:
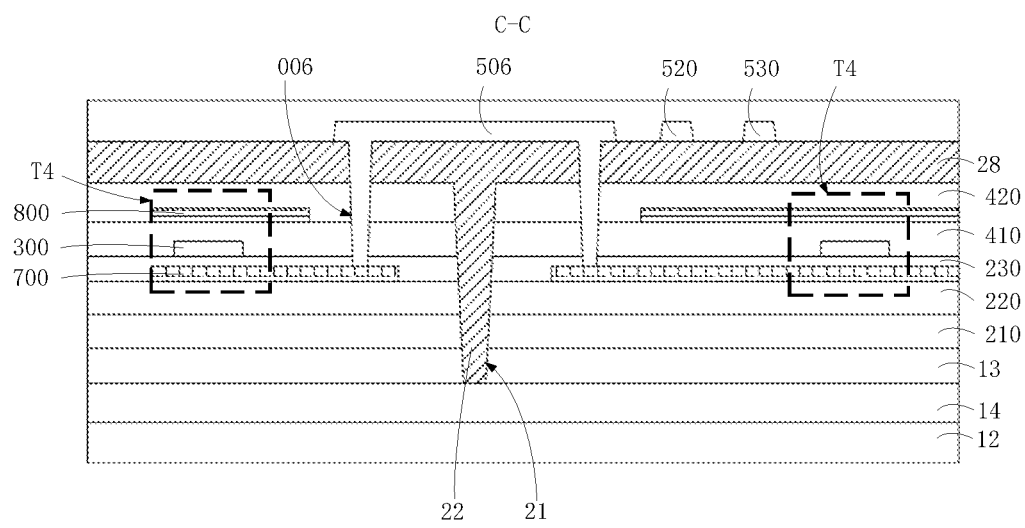
FIG. 17 is a schematic cross-sectional structural diagram at position C-C in FIG. 16.
Figure 18:
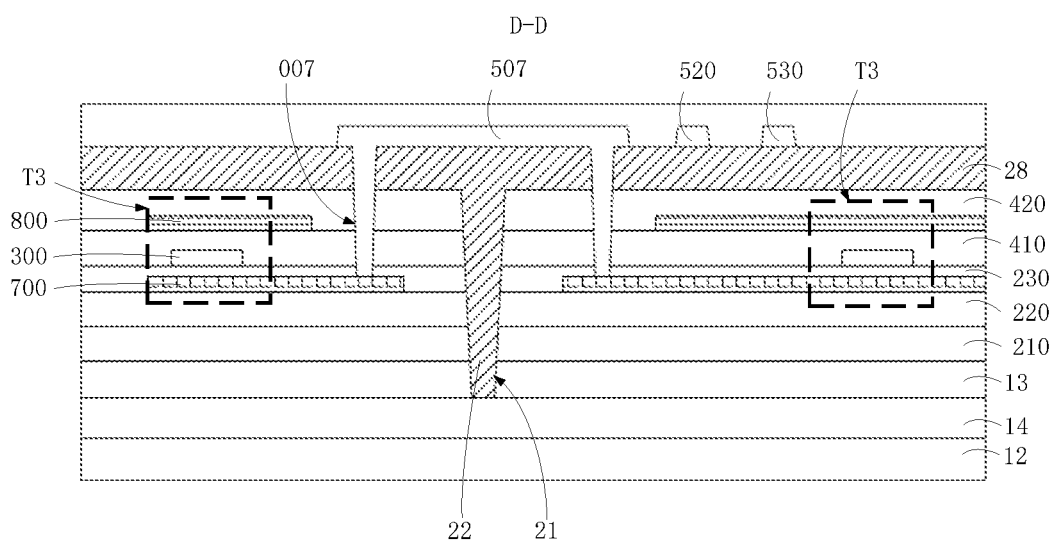
FIG. 18 is a schematic cross-sectional structural diagram at position D-D in FIG. 16.
Figure 19:
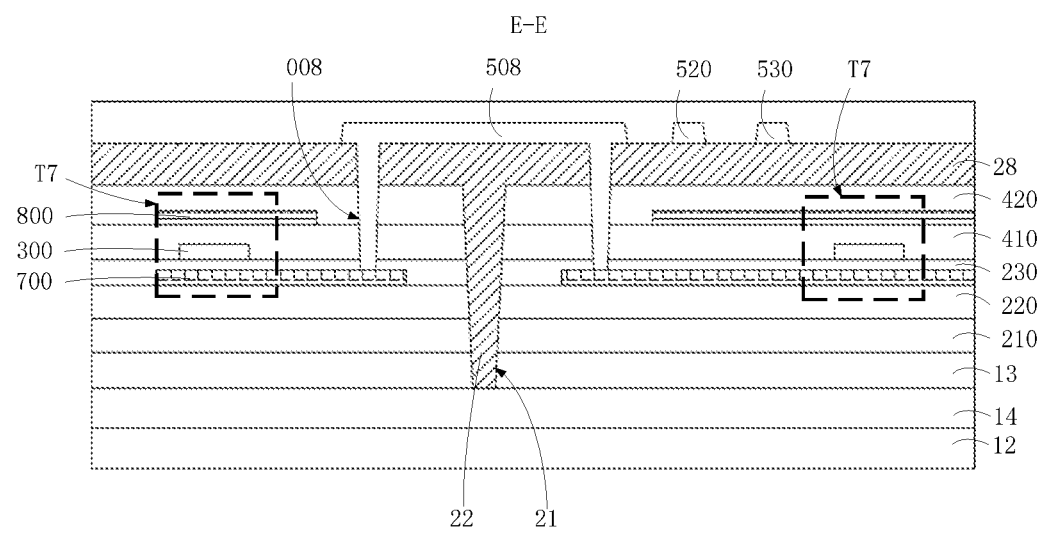
FIG. 19 is a schematic cross-sectional structural diagram at position E-E in FIG. 16.
Figure 20:
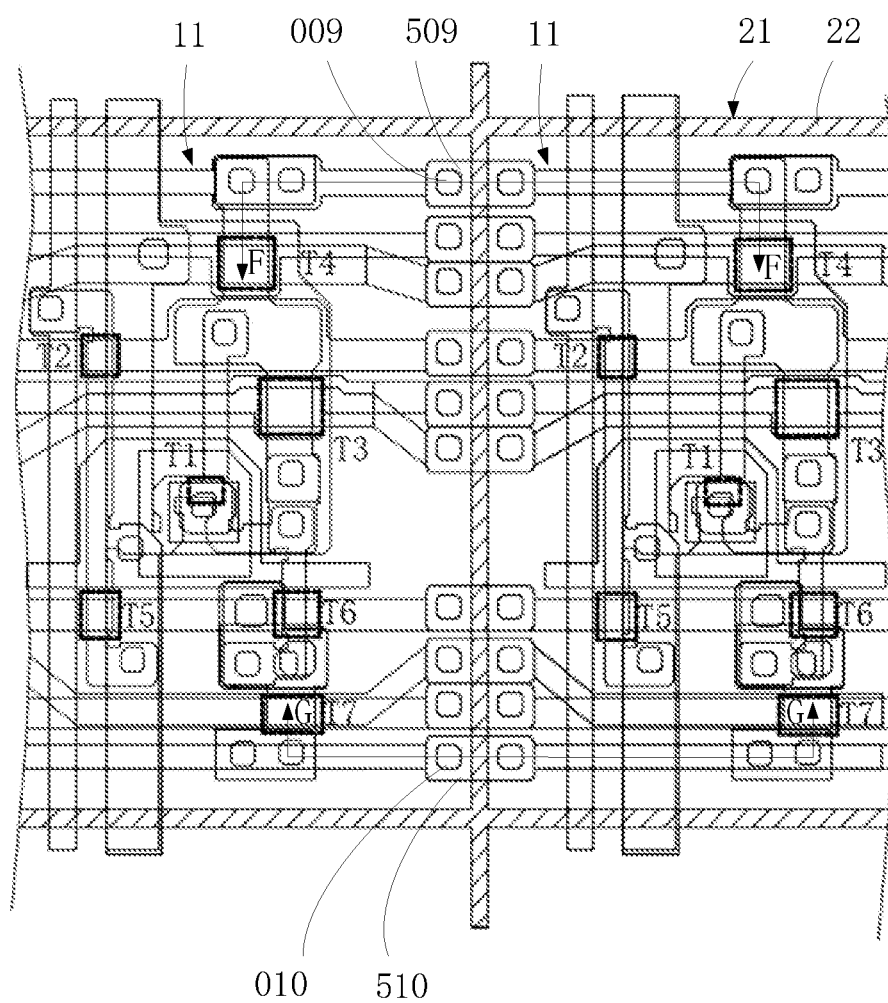
FIG. 20 is a schematic structural diagram of a structure in which two adjacent pixel driving circuits located in different sub-areas are bridged in a second active layer in the display panel according to an embodiment of the present disclosure.
Figure 21:
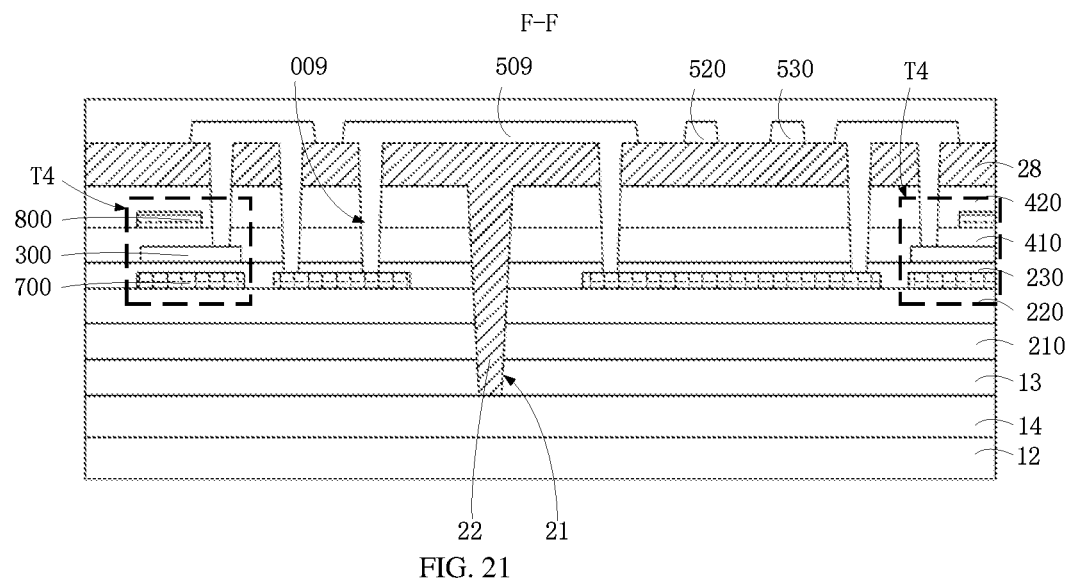
FIG. 21 is a schematic cross-sectional structural diagram at position F-F in FIG. 20.
Figure 22:
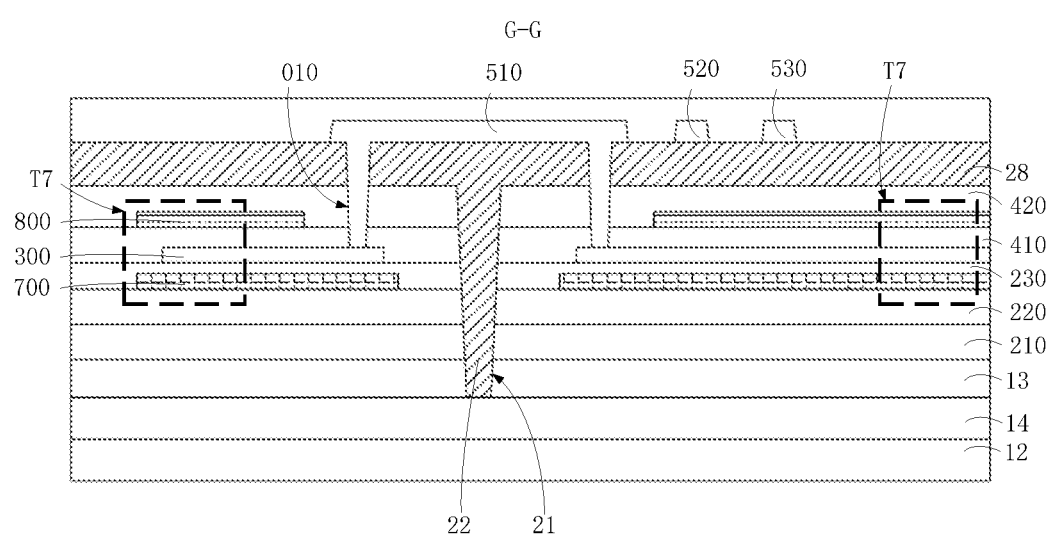
FIG. 22 is a schematic cross-sectional structural diagram at position G-G in FIG. 20.
Figure 23:
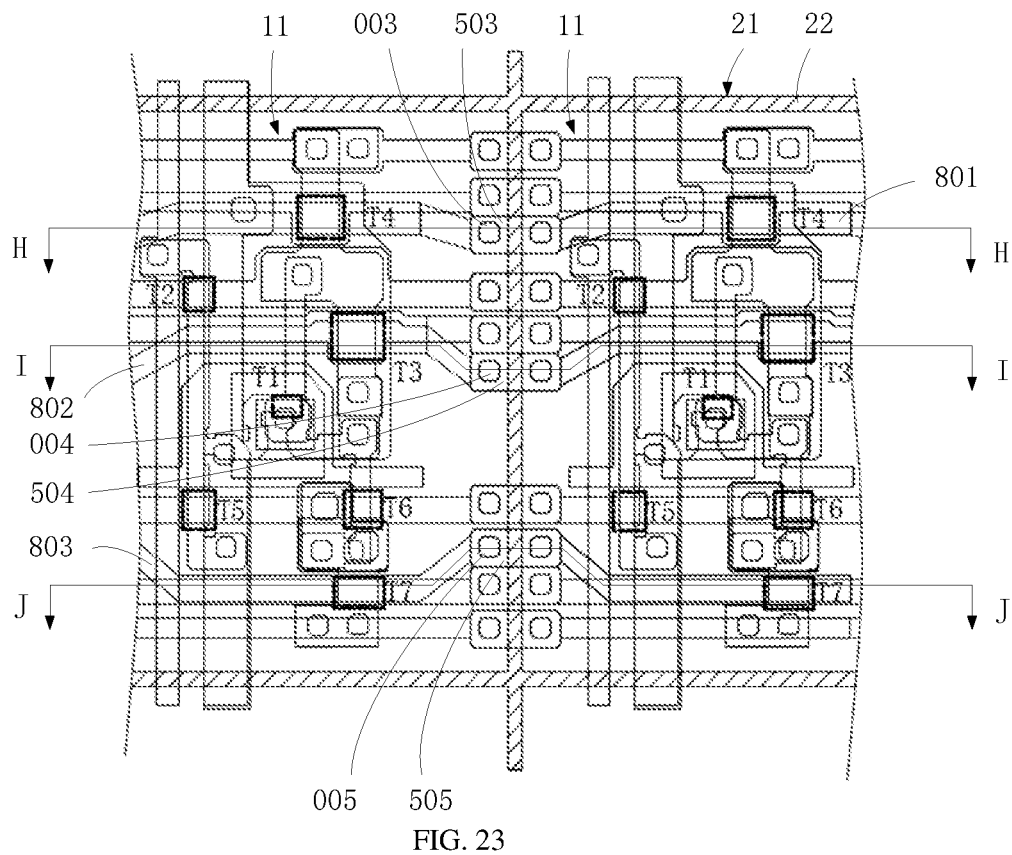
FIG. 23 is a schematic structural diagram of a structure in which two adjacent pixel driving circuits located in different sub-areas are bridged in a fourth metal layer in the display panel according to an embodiment of the present disclosure.
Figure 24:
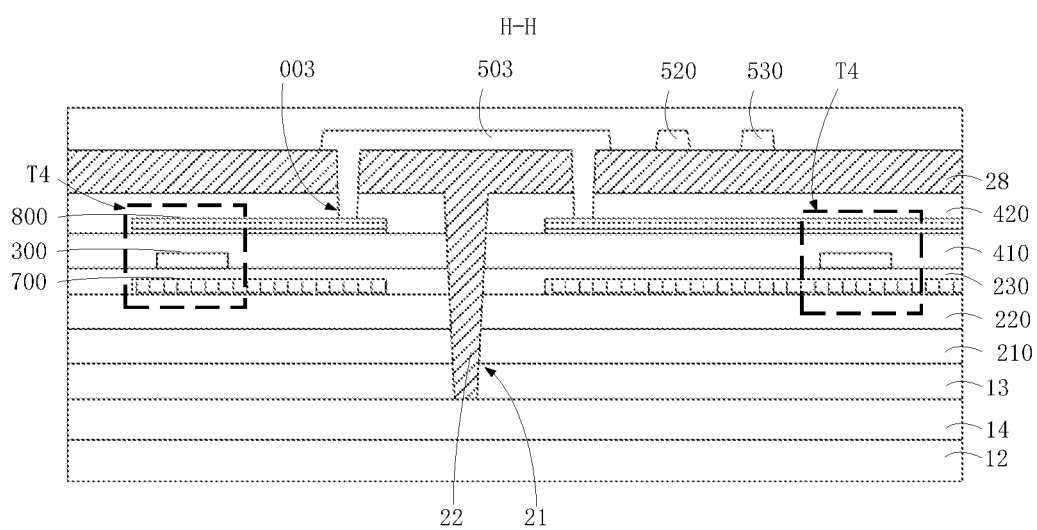
FIG. 24 is a schematic cross-sectional structural diagram at position H-H in FIG. 23.
Figure 25:
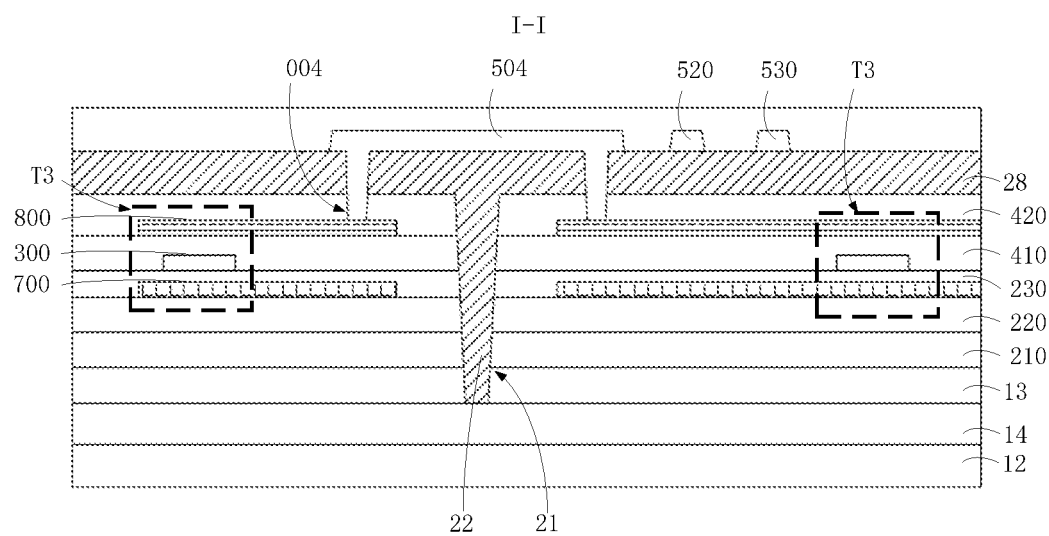
FIG. 25 is a schematic cross-sectional structural diagram at position I-I in FIG. 23.
Figure 26:
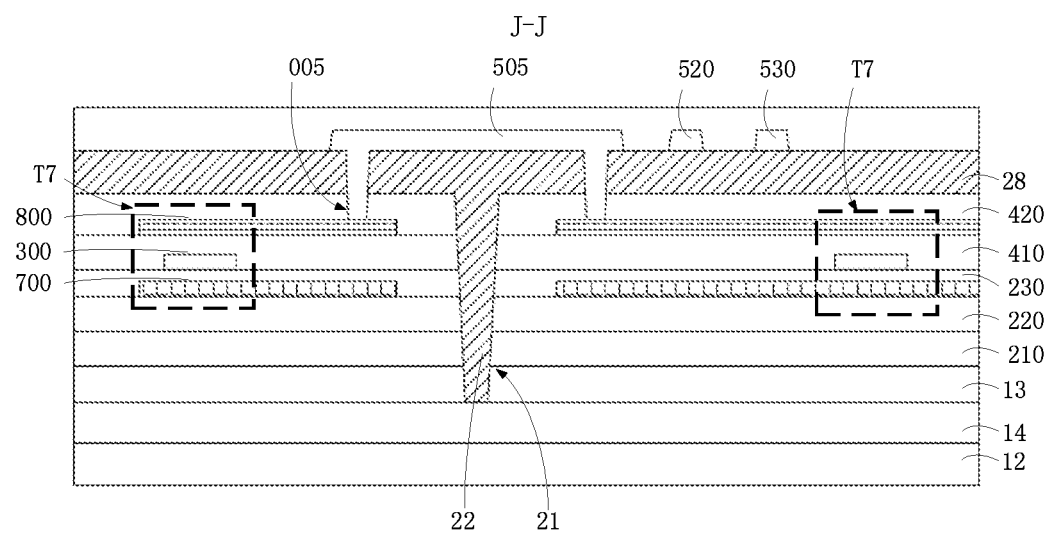
FIG. 26 is a schematic cross-sectional structural diagram at position J-J in FIG. 23.

It is should be noted that, referring to FIG. 16, the sixth via 006, the seventh via 007, and the eighth via 008 may be disposed in the sub-area 11 and located on the peripheral side of the sub-area 11, which prevents positions of the sixth via 006, the seventh via 007, and the eighth via 008 from overlapping with the positions of the pixel driving_circuits to increase the wire complexity. In addition, along an extension direction of the sixth scan signal line 701, when at least two pixel driving circuits are disposed in one of the sub-areas 11, the sixth scan signal lines 701 in each of the pixel driving circuits can be connected in a same layer. Similarly, a connection principle of connection structures of the seventh scan signal line 702 and the eighth scan signal line 703 is the same as the connection principle of the sixth scan signal line 701, which will not be repeated here.

In this embodiment, referring to FIGS. 6, 10, 20, 21, and 22, the second semiconductor layer 300 forms an active layer of the first initialization transistor T4 and an active layer of the second initialization transistor T7;

The scan bridge wires comprise a ninth bridge wire 509 and a tenth bridge wire 510, and the pixel driving circuit layer 20 comprises a ninth via 009 and a tenth via 010 penetrating the fourth insulating sub-layer 410 and the fifth insulating sub-layer 420. The ninth bridge wire 509 is connected to the active layer of the first initialization transistor T4 through the ninth via 009, and the tenth bridge wire 510 is connected to the active layer of the second initialization transistor T7 through The tenth via 010.

It is understandable that, the second semiconductor layer 300 is disposed on the third insulating sub-layer 230, and is patterned to form the active layer of the first initialization transistor T4 and the active layer of the second initialization transistor T7. The ninth bridge wire 509 is connected to the active layer of the first initialization transistor T4 through the ninth via 009, and the tenth bridge wire 510 is connected to the active layer of the first initialization transistor T4 through the tenth via 010. Wherein, a portion of the active layer of the first initialization transistor T4 connected to the ninth bridge wire 509 undergoes a conductive process, and a portion of the active layer of the second initialization transistor T7 connected to the tenth bridge wire 510 undergoes the conductive process to ensure that there is a better connection and conduction effect between the active layer of the first initialization transistor T4 and the ninth bridge wire 509, and between the active layer of the second initialization transistor T7 and the tenth bridge wire 510.

It should be noted that, the second semiconductor layer 300 is formed on the third insulating sub-layer 230, and the active layers of the compensation transistor T3, the first initialization transistor T4, and the second initialization transistor T7 formed by patterning are oxide active layers. Wherein, the oxide active layers of the compensation transistor T3 and the first initialization transistor T4 are connected to each other, and the oxide active layer of the second initialization transistor T7 is independent of other transistors. Materials of the oxide active layers may comprise at least one of zinc oxide (ZnO), zinc tin oxide (ZTO), zinc indium oxide (ZIO), indium oxide (InO), titanium oxide (TiO), indium gallium zinc oxide (IGZO), or indium oxide zinc tin (IZTO).

In one embodiment, referring to FIG. 6, FIG. 11, FIG. 23, FIG. 24, FIG. 25, and FIG. 26, the fourth metal layer 800 is patterned to form a top gate of the first initialization transistor T4, and a top gate of the compensation transistor T3, a top gate of the second initialization transistor T7, a third scan signal line 801 connected to the top gate of the first initialization transistor T4, a fourth scan signal line 802 connected to the top gate of the compensation transistor T3, and a fifth scan signal line 803 connected to the top gate of the second initialization transistor T7;

The scan bridge wires comprise a third bridge wire 503, a fourth bridge wire 504, and a fifth bridge wire 505. The pixel driving circuit layer 20 comprises a third via 003, a fourth via 004, and a fifth via 005 penetrating the fourth insulating sub-layer 410 and the fifth insulating sub-layer 420. The third bridge wire 503 is connected to the third scan signal line 801 through the third via 003, the fourth bridge wire 504 is connected to the fourth scan signal line 802 through the fourth via 004, and the fifth bridge wire 505 is connected to the fifth scan signal line 803 through the fifth via 005.

It can be understood that, the fourth metal layer 800 is formed on the fourth insulating sub-layer 410, and the fourth metal layer 800 is patterned to form the third scan signal line 801 connected to the top gate of the first initialization transistor T4, the fourth scan signal line 802 connected to the top gate of the compensation transistor T3, and the fifth scan signal line 803 connected to the top gate of the second initialization transistor T7. The third bridge wire 503 is connected to the third scan signal line 801 through the third via 003, the fourth bridge wire 504 is connected to the fourth scan signal line 802 through the fourth via 004, and the fifth bridge wire 505 is connected to the fifth scan signal line 803 through the fifth via 005 to realize layer change connection of the third scan signal line 801, the fourth scan signal line 802, and the fifth scan signal line 803. Wherein, the third scan signal lines 801 in the two adjacent pixel driving circuits located in different sub-areas 11 are connected by the third bridge wire 503, that is, each end of the third bridge wire 503 is connected to the third scan signal line 801 in one of the pixel driving circuits. Similarly, each end of the fourth bridge wire 504 is connected to the fourth scan signal line 802 in one of the pixel driving circuits, and each end of the fifth bridge wire 505 is connected to the fifth scan signal line 803 in one of the pixel driving circuits, which will not be repeated here. In this embodiment, materials of the fourth metal layer 800 may comprise at least one metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), or tungsten (W).

Figure 11:
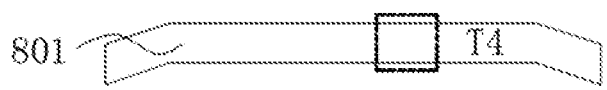
FIG. 11 is a schematic diagram of a planar structure of a fourth metal layer in the display panel provided by the embodiment of the present disclosure.
Figure 11:
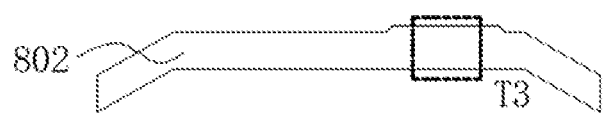
Figure 11:
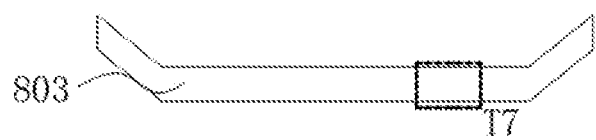
Figure 12:
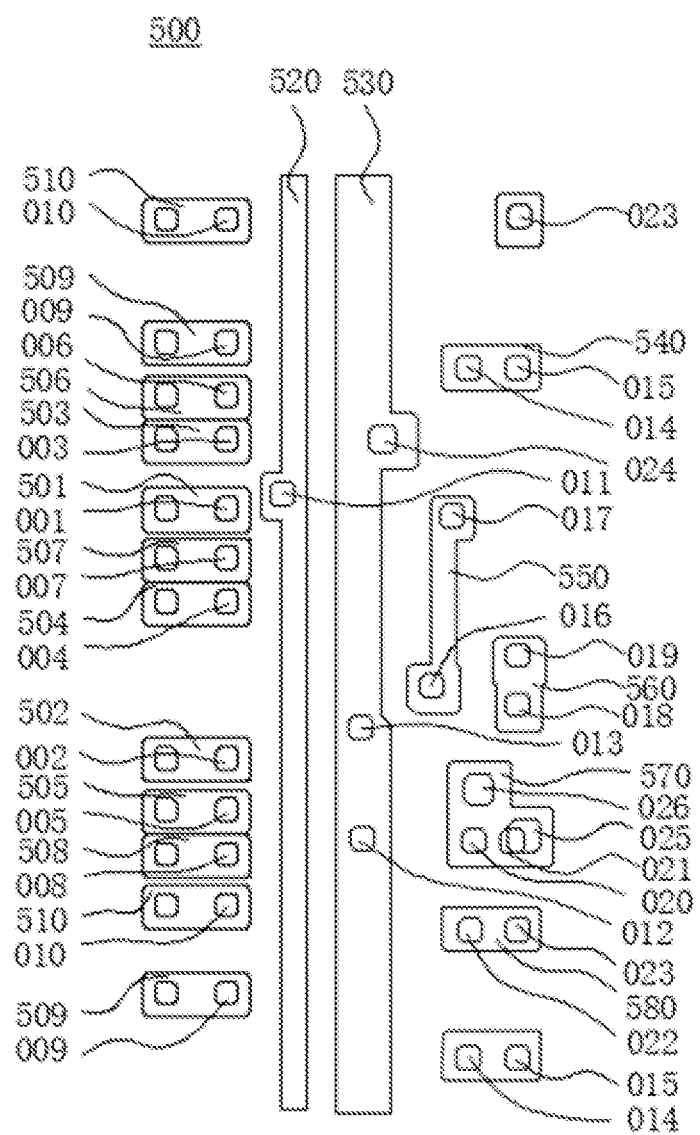
FIG. 12 is a schematic diagram of a planar structure of a first metal layer in the display panel provided by the embodiment of the present disclosure.

It should be noted that, referring to FIGS. 6 and 11, projections of the third scan signal line 801 and the oxide active layer on the substrate 12 have an intersection area, and a portion of the third scan signal line 801 in the intersection area forms the top gate of the first initialization transistor T4, and a portion of the oxide active layer in the intersecting area forms a channel region of the first initialization transistor T4. Projections of the fourth scan signal line 802 and the oxide active layer on the substrate 12 have is an intersection area, a portion of the fourth scan signal line 802 located in the intersection area forms the top gate of the compensation transistor T3, and a portion of the oxide active layer located in the intersection area forms a channel region of the compensation transistor T3. Projections of the fifth scan signal line 803 and the oxide active layer on the substrate 12 also have an intersection area, a portion of the fifth scan signal line 803 located in the intersection area forms the top gate of the second initialization transistor T7, and a portion of the oxide active layer located at the intersection area forms a channel region of the second initialization transistor T7.

Parts of the oxide active layer excluding the above-mentioned channel regions forms source and drain regions of each oxide transistor. Through an arrangement of the third bridge wire 503, the fourth bridge wire 504, the fifth bridge wire 505, the third scan signal line 801, the fourth scan signal line 802, and the fifth scan signal line 803, connections between the second electrode of the compensation transistor T3 and the second electrode of the first initialization transistor T4, and between the first electrode of the first initialization transistor T4 and the first electrode of the second initialization transistor T7 are achieved.

It should be noted that, the third via 003, the fourth via 004, and the fifth via 005 may be arranged in the sub-area 11 and located on the peripheral side of the sub-area 11, so as to prevent positions of the third via 003, the fourth via 004, and the fifth via 005 from overlapping the positions of the pixel driving circuits to increase the wire complexity. In addition, along an extension direction of the third scan signal line 801, when at least two pixel driving circuits are disposed in one of the sub-areas 11, the third scan signal line 801 in each of the pixel driving circuits may be connected in a same layer. Similarly, a connection principle of connection structures of the fourth scan signal line 802 and the fifth scan signal line 803 is the same as a connection principle of the third scan signal lines 801, which will not be repeated here.

In one embodiment, referring to FIG. 6 to FIG. 12, the first metal layer 500 is further patterned to form a data signal line 520, a power high-potential signal line 530, a first connection line 540, a second connection line 550, a third connection line 560, a fourth connection line 570, and a fifth connection line 580. Materials of a first source-drain layer 800 comprises at least one element or alloy of Mo, Al, Cu, Tl, or the like.

The data signal line 520 is connected to the polysilicon active layer of the switching transistor T2 through an eleventh via 011; the power high-potential signal line 530 is connected to the polysilicon active layer of the first light-emitting control signal line T5 through an twelfth via 012, and is connected to the first plate 603 of the storage capacitor C1 through an thirteenth via 013 which needs to penetrate a capacitor via 7041 formed in the second plate 704 of the storage capacitor; the first connection line 540 is connected to the oxide active layer of the first initialization transistor T4 through a fourteenth via 014 to form the first electrode of the first initialization transistor T4, and is then connected to the initialization signal line VI through a fifteenth via 015; the second connection line 550 is connected to the gate of the driving transistor T1 and the second plate 704 of the storage capacitor C1 through a sixteenth via 016, and is connected to the oxide active layer of the first initialization transistor T4 through a seventeenth via 017 to form the second electrode of the first initialization transistor T4; the third connection line 560 is connected to the polysilicon active layer of the driving transistor T1 and the second light-emitting control transistor T6 through an eighteenth via 018 to form the second electrode of the driving transistor T1 and the first electrode of the second light-emitting control transistor, and is connected to the oxide active layer of the compensation transistor T3 through a nineteenth via 019 to form the second electrode of the compensation transistor T3; the fourth connection line 570 is connected to the polysilicon active layer of the second light emitting control transistor T6 through a twentieth via 020 to form the second electrode of the second light-emitting control transistor T6, and is connected to the oxide active layer of the second initialization transistor T7 through a twenty-first via 021 to form the second electrode of the second initialization transistor T7; and the fifth connection line 580 is connected to the oxide active layer of the second initialization transistor T7 through a twenty-second via 022 to form the first electrode of the second initialization transistor T7, and then is connected to the initialization signal line VI through a twenty-third via 023. In addition, the power high-potential signal line 530 is connected to the fifth metal layer 900 through a twenty-fourth via 024. The fifth metal layer 900 is also patterned to form a blocking member (not shown in the figure). The blocking member forms a second drain of the second light-emitting control transistor T6, is connected to the second electrode of the second light-emitting control transistor T6 through a twenty-fifth via 025, and is connected to the anode of the light-emitting device D1 through a twenty-sixth via 026.

It should be noted that, on the basis of the above structure, the ninth bridge wire 509 can be connected to the first electrode of the first initialization transistor T4 to achieve a connection with the oxide active layer of the first initialization transistor T4. The tenth bridge wire 510 can be connected to the first electrode of the second initialization transistor T7 to realize connection with the active layer of the second initialization transistor T7.

In summary, in the display panel provided by the present disclosure, the first insulating layer 200 is provided with the first grooves 21 located between the pixel driving circuits, and the first organic spacer layer 22 is disposed in the first grooves 21. Therefore, the stress generated when the display panel is bent can be concentrated and released at the first grooves 21, which reduces the influence of the bending stress on the performance of the thin film transistor devices, prevents the threshold voltage drift of the thin film transistors, and stabilizes the display brightness of the display panel during the bending process.

In summary, although preferred embodiments have been described above in the present disclosure, the above-mentioned preferred embodiments are not intended to limit the present disclosure. Those of ordinary skilled in the art can make various modifications and changes without departing from the spirit and scope of the present disclosure. Therefore, the protection scope of the present disclosure is subject to the scope defined by the claims.

What is claimed is:

1. A display panel comprising:
   a base; and
   a pixel driving circuit layer disposed on the base and comprising a plurality of pixel driving circuits;
   wherein the pixel driving circuit layer comprises: a first semiconductor layer, a first insulating layer, and a second semiconductor layer stacked on the base; and
   wherein the pixel driving circuit layer comprises first grooves located between the pixel driving circuits and opened in the first insulating layer, and a first organic spacer layer disposed in the first grooves;

wherein the display panel comprises a display area, and the first grooves comprise a plurality of first sub-grooves located in the display area and a plurality of second sub-grooves intersecting with the first sub-grooves, the plurality of the first sub-grooves and the plurality of the second sub-grooves divide the display area into a plurality of sub-areas, and at least one of the pixel driving circuits is disposed in each of the sub-areas;

wherein the display panel further comprises a bending wire area located at a side of the display area, a second insulating layer is disposed on the second semiconductor layer, and a first metal layer is disposed on the second insulating layer; and the pixel driving circuit layer comprises second grooves located in the bending wire area and penetrating at least the first insulating layer and the second insulating layer, and a second organic spacer layer disposed in the second grooves; and wherein the display area and the bending wire area are arranged side by side along a first direction, and a plurality of third grooves are opened in the second organic spacer layer; and in the first direction, two adjacent third grooves are arranged in a wave shape, and the third grooves are filled with an inorganic spacer layer.

2. The display panel of claim 1, wherein the display panel comprises at least one bending centerline in the display area, and the first sub-grooves or the second sub-grooves are arranged along a direction perpendicular to the bending centerline.

3. The display panel of claim 1, wherein the first metal layer comprises a plurality of signal wires extending along the first direction and located in the bending wire area, the plurality of third grooves are correspondingly disposed under each of the signal wires, and a part of each of the signal wires corresponding to the third grooves is arranged in a W shape along inner walls of each of the third grooves and located between the second organic spacer layer and the inorganic spacer layer.

4. The display panel of claim 3, wherein the pixel driving circuit layer further comprises a planarization layer disposed on the first metal layer, and the planarization layer and the inorganic spacer layer is an integrally formed structure.

5. A display panel comprising:
a base; and
a pixel driving circuit layer disposed on the base and comprising a plurality of pixel driving circuits;
wherein the pixel driving circuit layer comprises: a first semiconductor layer, a first insulating layer, and a second semiconductor layer stacked on the base; and
wherein the pixel driving circuit layer comprises first grooves located between the pixel driving circuits and opened in the first insulating layer, and a first organic spacer layer disposed in the first grooves;
wherein the display panel comprises a display area, and the first grooves comprise a plurality of first sub-grooves located in the display area and a plurality of second sub-grooves intersecting with the first sub-grooves, the plurality of the first sub-grooves and the plurality of the second sub-grooves divide the display area into a plurality of sub-areas, and at least one of the pixel driving circuits is disposed in each of the sub-areas;

wherein the display panel further comprises a bending wire area located at a side of the display area, a second insulating layer is disposed on the second semiconductor layer, and a first metal layer is disposed on the second insulating layer; and the pixel driving circuit layer comprises second grooves located in the bending wire area and penetrating at least the first insulating layer and the second insulating layer, and a second organic spacer layer disposed in the second grooves; and wherein the base comprises a substrate and an inorganic insulating layer disposed on the substrate, and the first grooves sequentially penetrate the inorganic insulating layer, the first insulating layer, and the second insulating layer, and the first organic spacer layer is filled in the first grooves.

6. The display panel of claim 5, wherein the base further comprises a buffer layer between the substrate and the inorganic insulating layer, and the second grooves penetrate the buffer layer, the organic insulating layer, the first insulating layer, and the second insulating layer, and the second organic spacer layer is filled in the second grooves.

7. A display panel comprising:
a base; and
a pixel driving circuit layer disposed on the base and comprising a plurality of pixel driving circuits;
wherein the pixel driving circuit layer comprises: a first semiconductor layer, a first insulating layer, and a second semiconductor layer stacked on the base; and
wherein the pixel driving circuit layer comprises first grooves located between the pixel driving circuits and opened in the first insulating layer, and a first organic spacer layer disposed in the first grooves;
wherein the display panel comprises a display area, and the first grooves comprise a plurality of first sub-grooves located in the display area and a plurality of second sub-grooves intersecting with the first sub-grooves, the plurality of the first sub-grooves and the plurality of the second sub-grooves divide the display area into a plurality of sub-areas, and at least one of the pixel driving circuits is disposed in each of the sub-areas;

wherein the display panel further comprises a bending wire area located at a side of the display area, a second insulating layer is disposed on the second semiconductor layer, and a first metal layer is disposed on the second insulating layer; and the pixel driving circuit layer comprises second grooves located in the bending wire area and penetrating at least the first insulating layer and the second insulating layer, and a second organic spacer layer disposed in the second grooves; and wherein the first metal layer comprises scan bridge wires located on the second insulating layer and the first organic spacer layer, two adjacent pixel driving circuits located in different sub-areas are bridged by the scan bridge wires.

8. The display panel of claim 7, wherein the display panel further comprises a plurality of light-emitting devices arranged in an array, and the pixel driving circuits are configured to drive the light emitting devices to emit light, and each of the pixel driving circuits comprises:
a first initialization transistor configured to input an initialization signal to a first node under control of a first scan signal;
a switching transistor configured to input a data signal to a second node under control of a second scan signal;

a driving transistor configured to drive one of the light-emitting devices to emit light under control of potentials of the first node and the second node;

a compensation transistor connected to the driving transistor through the first node and a third node, and configured to compensate a threshold voltage of the driving transistor under control of the third scan signal;

a second initialization transistor configured to input the initialization signal to an anode of the light-emitting device under the control of the third scan signal;

a first light-emitting control transistor connected to the driving transistor through the second node, and configured to turn on a current flowing from a power high-potential signal line to the driving transistor under control of a light-emitting control signal;

a second light-emitting control transistor connected to the driving transistor through the third node, and configured to turn on a current flowing from the driving transistor to the anode of the light-emitting device under the control of the light-emitting control signal; and a storage capacitor connected to the driving transistor through the first node, and connected to the power high-potential signal line through a fourth node, and configured to store the data signal;

wherein the scan bridge wires are respectively bridged with the first initialization transistor, the switching transistor, the compensation transistor, the second initialization transistor, the first light-emitting control transistor, and the second light-emitting control transistor through vias.

9. The display panel of claim 8, wherein the first insulating layer comprises a first insulating sub-layer disposed on the first semiconductor layer, a second insulating sub-layer disposed on the first insulating sub-layer, and a third insulating sub-layer disposed on the second insulating sub-layer, and the second insulating layer comprises a fourth insulating sub-layer disposed on the second semiconductor layer and a fifth insulating layer disposed on the fourth insulating sub-layer; and wherein each of the pixel driving circuits comprises a second metal layer disposed between the first insulating sub-layer and the second insulating sub-layer, a third metal layer disposed between the second insulating sub-layer and the third insulating sub-layer, and a fourth metal layer disposed between the fourth insulating sub-layer and the fifth insulating sub-layer.

10. The display panel of claim 9, wherein the second metal layer is patterned to form a gate of the switching transistor, a gate of the light-emitting control transistor, a gate of the second light-emitting control transistor, a gate of the driving transistor, a first scan signal line connected to the gate of the switching transistor, a second scan signal line connected to the gate of the light emitting control transistor and the gate of the second light emitting control transistor, and a first plate of the storage capacitor, and the gate of the driving transistor is connected to the first plate of the storage capacitor; and the scan bridge wires comprise a first bridge wire and a second bridge wire, and each of the pixel driving circuit layers comprises a first via and a second via penetrating the second insulating sub-layer, the third insulating sub-layer, the fourth insulating sub-layer, and the fifth insulating layer, the first bridge wire is connected to the first scan signal line through the first via, and the second bridge wire is connected to the second scan signal line through the second via.

11. The display panel of claim 9, wherein the fourth metal layer is patterned to form a top gate of the first initialization transistor, a top gate of the compensation transistor, and a top gate of the second initialization transistor, a third scan signal line connected to the top gate of the first initialization transistor, a fourth scan signal line connected to the top gate of the compensation transistor, and a fifth scan signal line connected to the top gate of the second initialization transistor; and the scan bridge wires comprise a third bridge wire, a fourth bridge wire, and a fifth bridge wire, and each of the pixel driving circuit layers comprises a third via, a fourth via, and a fifth via penetrating the fourth insulating sub-layer and the fifth insulating sub-layer, the third bridge wire is connected to the third scan signal line through the third via, the fourth bridge wire is connected to the fourth scan signal line through the fourth via, and the fifth bridge wire is connected to the fifth scan signal line through the fifth via.

12. The display panel of claim 9, wherein the third metal layer is patterned to form a bottom gate of the first initialization transistor, a bottom gate of the compensation transistor, a bottom gate of the second initialization transistor, a sixth scan signal line connected to the bottom gate of the first initialization transistor, a seventh scan signal line connected to the bottom gate of the compensation transistor, an eighth scan signal line connected to the bottom gate of the second initialization transistor, and a second plate of the storage capacitor; and the scan bridge wires comprise a sixth bridge wire, a seventh bridge wire, and an eighth bridge wire, and each of the pixel driving circuit layers comprises a sixth via, a seventh via, and an eighth via penetrating the third insulating sub-layer, the fourth insulating sub-layer, and the fifth insulating sub-layer, the sixth bridge wire is connected to the sixth scan signal line through the sixth via, the seventh bridge wire is connected to the seventh scan signal line through the seventh via, and the eighth bridge wire is connected to the eighth scan signal line through the eighth via.

13. The display panel of claim 12, wherein the second semiconductor layer forms an active layer of the first initialization transistor and an active layer of the second initialization transistor; and the scan bridge wires comprise a ninth bridge wire and a tenth bridge wire, and each of the pixel driving circuit layers comprises a ninth via and a tenth via penetrating the fourth insulating sub-layer and the fifth insulating sub-layer, the ninth bridge wire is connected to the active layer of the first initialization transistor through the ninth via, and the tenth bridge wire is connected to the active layer of the second initialization transistor through the tenth via.

14. The display panel of claim 7, wherein the display panel comprises at least one bending centerline in the display area, and the first sub-grooves or the second sub-grooves are arranged along a direction perpendicular to the bending centerline.

* * * * *